(12) United States Patent
Robinett et al.

(10) Patent No.: US 7,778,061 B2
(45) Date of Patent: Aug. 17, 2010

(54) CROSSBAR-MEMORY SYSTEMS AND METHODS FOR WRITING TO AND READING FROM CROSSBAR MEMORY JUNCTIONS OF CROSSBAR-MEMORY SYSTEMS

(75) Inventors: Warren Robinett, Pittsboro, NC (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 102 days.

(21) Appl. No.: 11/582,208

(22) Filed: Oct. 16, 2006

(65) Prior Publication Data

US 2008/0089110 A1  Apr. 17, 2008

(51) Int. Cl.
*G11C 11/00* (2006.01)
(52) U.S. Cl. .................. 365/148; 365/230.02; 257/776
(58) Field of Classification Search ................ 365/158, 365/148, 230.02; 257/776; 370/916
See application file for complete search history.

(56) References Cited

U.S. PATENT DOCUMENTS

| 6,128,214 | A | 10/2000 | Kuekes et al. |
|---|---|---|---|
| 2004/0041617 | A1 | 3/2004 | Snider et al. |
| 2004/0113138 | A1 | 6/2004 | Dehon et al. |
| 2005/0055387 | A1 | 3/2005 | Kuekes et al. |
| 2006/0129340 | A1 | 6/2006 | Straznicky |
| 2007/0053378 | A1* | 3/2007 | Kuekes et al. ............... 370/464 |
| 2007/0094756 | A1* | 4/2007 | Snider et al. ................. 977/762 |
| 2007/0176801 | A1* | 8/2007 | Robinett et al. ............... 341/50 |

OTHER PUBLICATIONS

Snider et al., Nano State Machines Using Hysteretic Resistors and Dlode Crossbars, Mar. 2006, IEEE Transactoins on Nanotechnology, vol. 5, No. 2, All pages.*

Stewart et al., Molecule-Independent Electrical Switching in Pt/Organic Monolayer/Ti Devices, Dec. 19, 2003, Nano Letters 2004, vol. 4, No. 1 133-136, all pages pertinent.*

* cited by examiner

*Primary Examiner*—Hoai V Ho
*Assistant Examiner*—Fernando N Hidalgo

(57) ABSTRACT

Various embodiments of the present invention are directed to crossbar-memory systems to methods for writing information to and reading information stored in such systems. In one embodiment of the present invention, a crossbar-memory system comprises a first layer of microscale signal lines, a second layer of microscale signal lines, a first layer of nanowires configured so that each first layer nanowire overlaps each first layer microscale signal line, and a second layer of nanowires configured so that each second layer nanowire overlaps each second layer microscale signal line and overlaps each first layer nanowire. The crossbar-memory system includes nonlinear-tunneling resistors configured to selectively connect first layer nanowires to first layer microscale signal lines and to selectively connect second layer nanowires to second layer microscale signal lines. The crossbar-memory system also includes nonlinear tunneling-hysteretic resistors configured to connect each first layer nanowire to each second layer nanowire at each crossbar intersection.

10 Claims, 27 Drawing Sheets

| | | |
|---|---|---|
| 1108 { | 000001 | 0101000111 |
| | 000010 | 0101100101 |
| | 000011 | 1111000100 |
| | 000100 | 1001110001 |
| | 000101 | 0101010011 |
| | $a_5$ | $u_5$ |
| | $a_6$ | $u_6$ |
| | $a_7$ | $u_7$ |
| | $a_8$ | $u_8$ |
| | $a_9$ | $u_9$ |
| | $a_{10}$ | $u_{10}$ |
| | $a_{11}$ | $u_{11}$ |
| | $a_{12}$ | $u_{12}$ |
| | $a_{13}$ | $u_{13}$ |
| | $a_{14}$ | $u_{14}$ |
| | ... | ... |
| | $a_{m-6}$ | $u_{m-6}$ |
| | $a_{m-5}$ | $u_{m-5}$ |
| | $a_{m-4}$ | $u_{m-4}$ |
| | $a_{m-3}$ | $u_{m-3}$ |
| | $a_{m-2}$ | $u_{m-2}$ |
| | $a_{m-1}$ | $u_{m-1}$ |

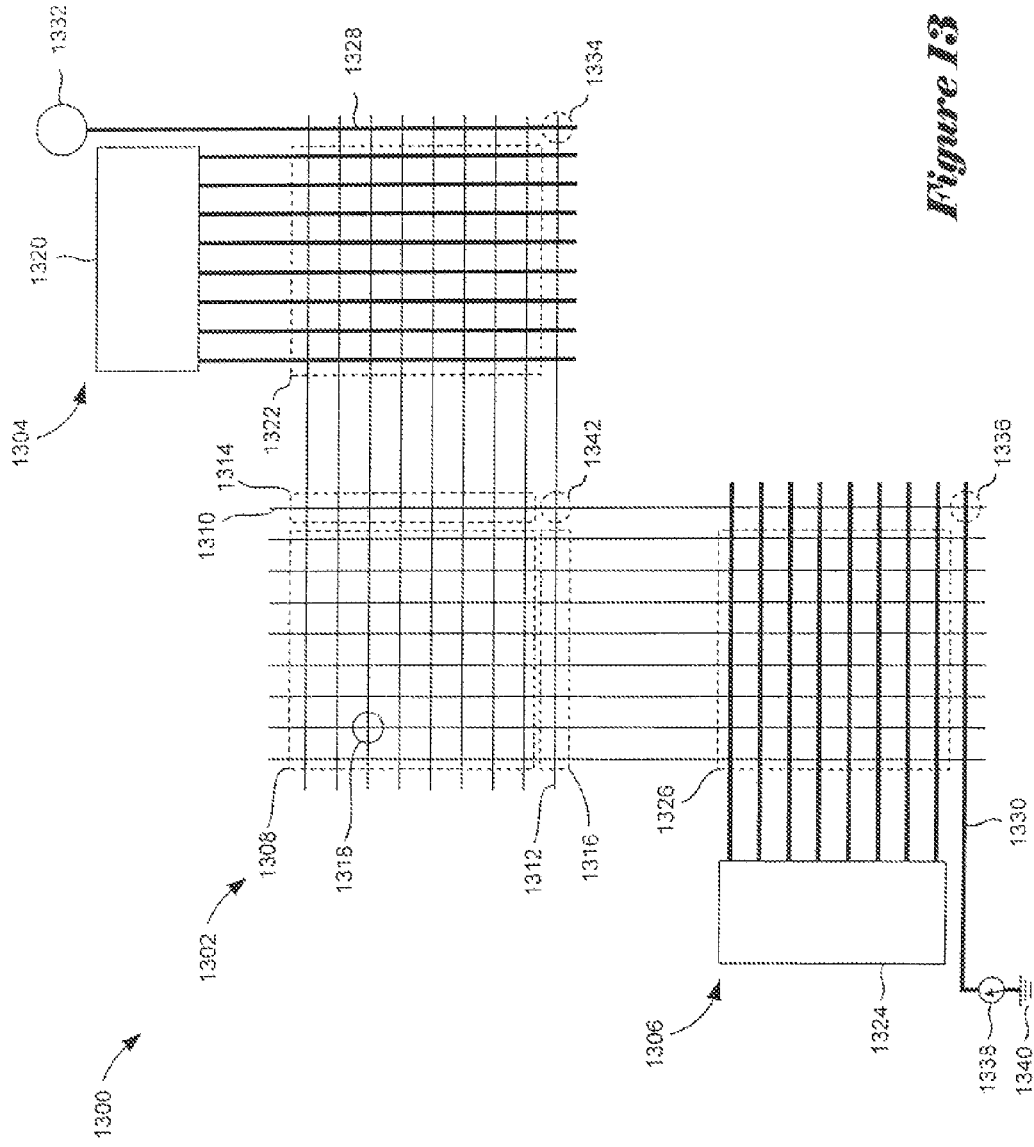

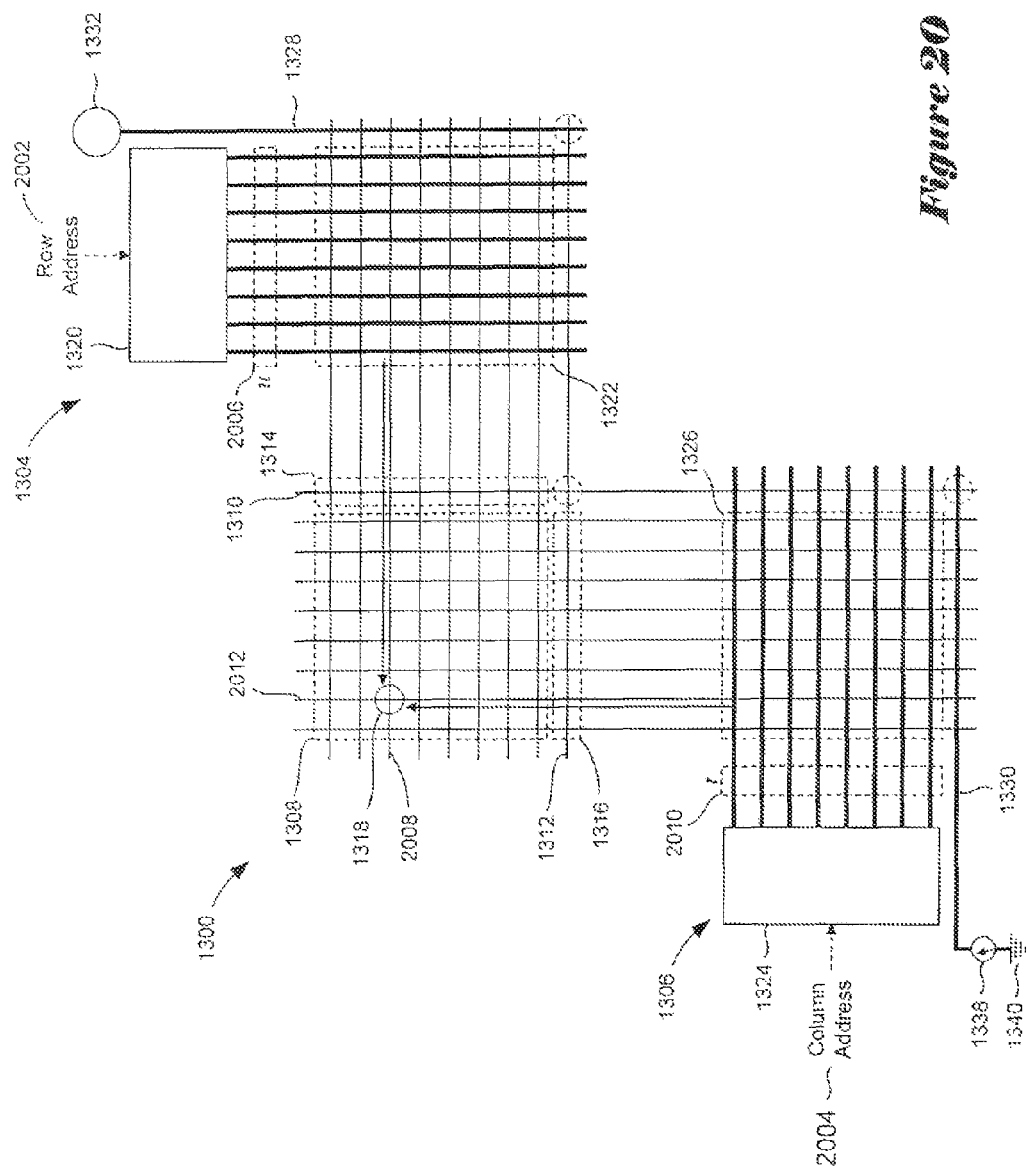

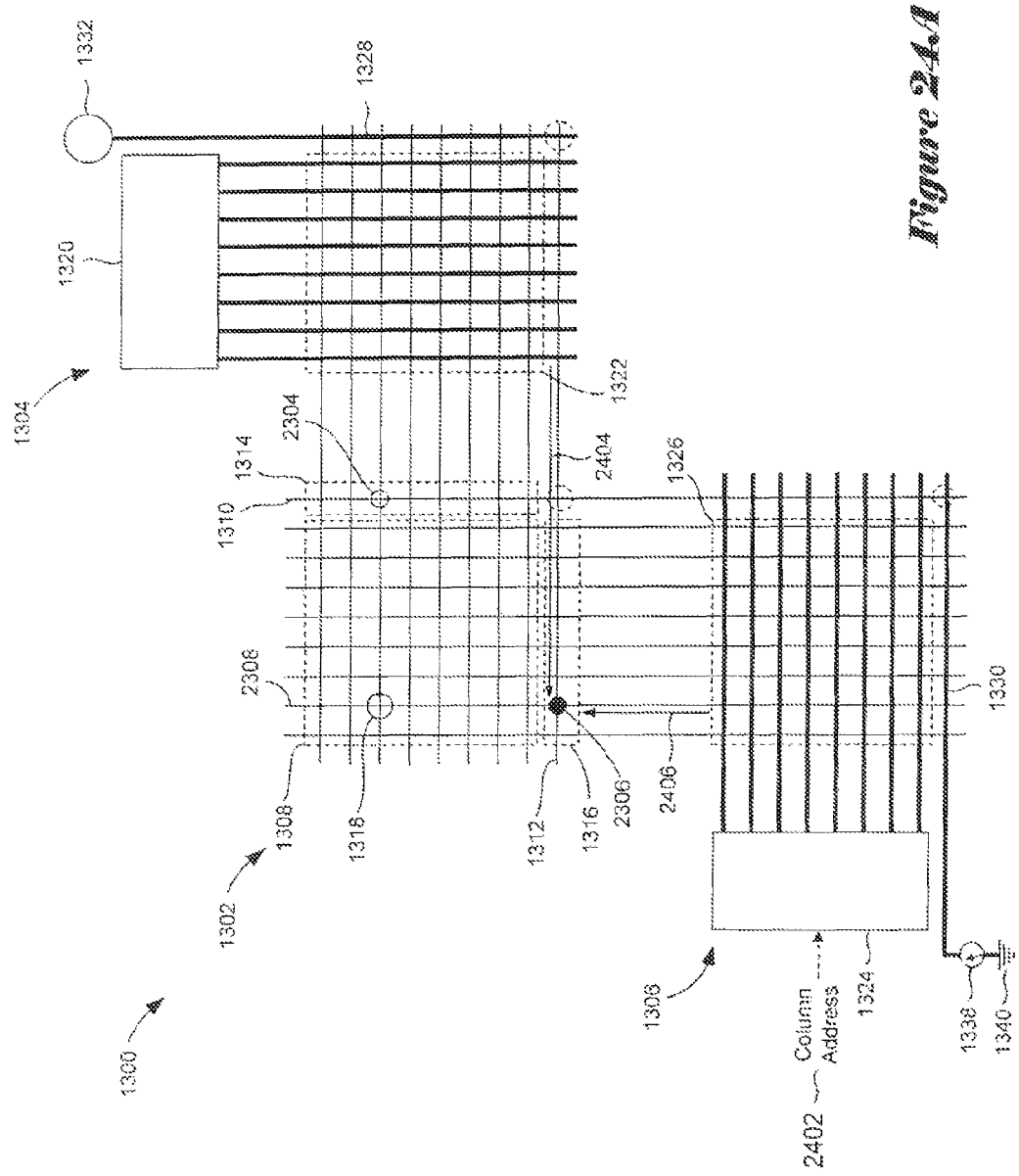

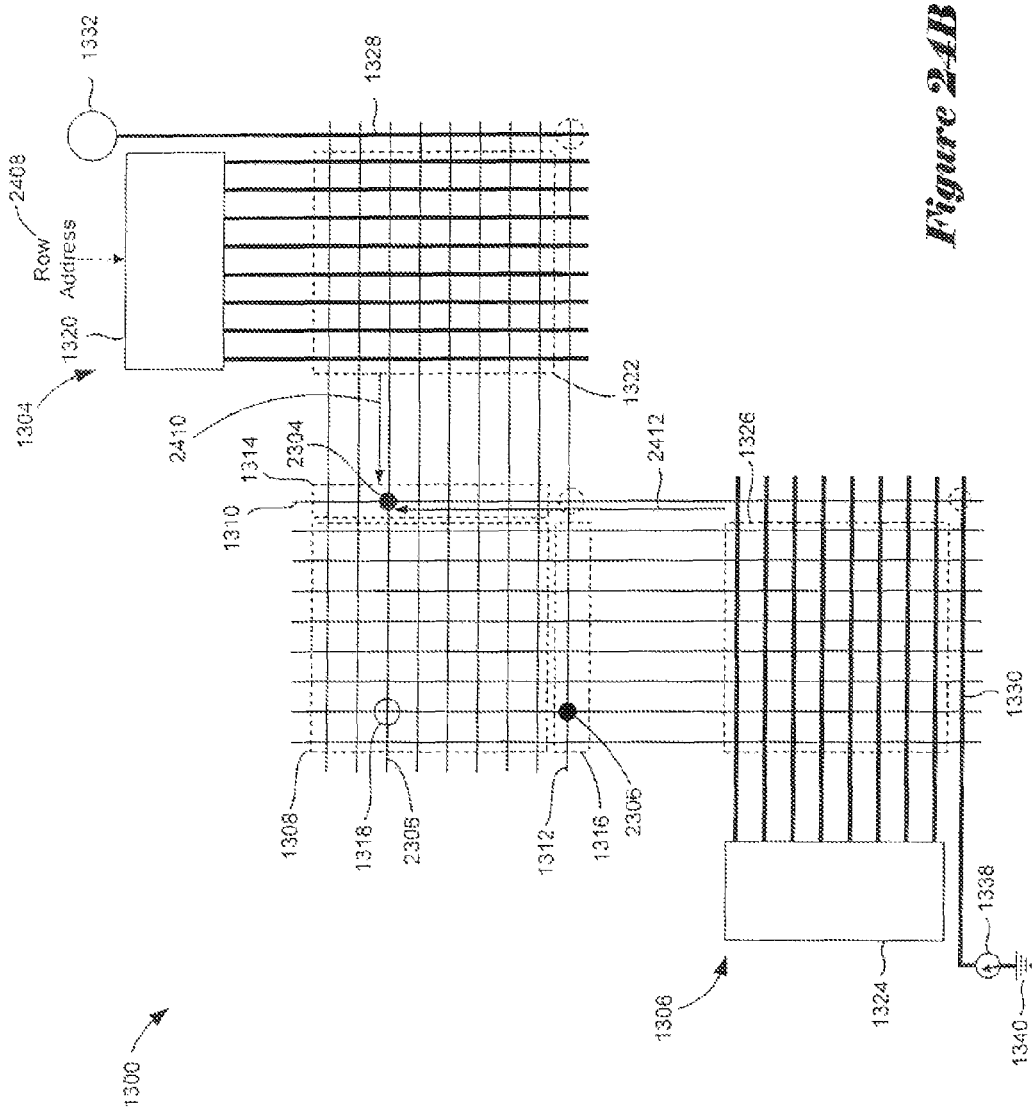

CROSSBAR-MEMORY SYSTEMS AND METHODS FOR WRITING TO AND READING FROM CROSSBAR MEMORY JUNCTIONS OF CROSSBAR-MEMORY SYSTEMS

TECHNICAL FIELD

The present invention is related to nanoscale and combined microscale/nanoscale electronics and, in particular, to crossbar-memory systems configured so that information can be written to, and read from, crossbar memory junctions of the crossbar-memory systems.

BACKGROUND OF THE INVENTION

Significant research and development efforts are currently directed towards designing and manufacturing nanoscale electronic devices, including nanoscale memories. Nanoscale electronics promise a number of advantages over microscale, photolithography-based electronics, including significantly reduced features sizes and the potential for self-assembly and for other relatively inexpensive, non-photolithography-based fabrication methods. However, the design and manufacture of nanoscale electronic devices present many new problems that need to be addressed prior to large-scale commercial production of nanoscale electronic devices and incorporation of nanoscale electronic devices into microscale and larger-scale systems, devices, and products.

Nanoscale crossbar-memory arrays are possible candidates for relatively near-term commercialization. Nanoscale crossbar-memory arrays can be composed of a first layer of approximately parallel nanowires overlain by a second layer of approximately parallel nanowires, the orientation of the nanowires of the first layer are approximately perpendicular to the nanowires of the second layer. A resistor is located at each point where a nanowire in the second layer overlaps a nanowire in the first layer and is called a "crossbar-memory junction." The nanowires of the first layer are addressed through selective interconnections to microscale output signal lines of a first combined microscale/nanoscale encoder-demultiplexer, and the nanowires of the second layer are addressed through selective interconnections to microscale output signal lines of a second combined microscale/nanoscale encoder-demultiplexer. Resistors are located at selected combined microscale/nanoscale crossbar junctions of the encoder-demultiplexers. A nanowire address is input to an encoder via microscale address lines and is transformed into a pattern of addressed-nanowire selection voltages that are output by the encoder to the microscale output signal lines of the encoder-demultiplexer. Selection of the two nanowires that cross at a particular crossbar-memory junction by the two encoder-demultiplexers results in applying a defined voltage to the crossbar-memory junction selected by input of two nanowire addresses to the two encoder-demultiplexers.

Relatively large voltages can be applied to a given crossbar-memory junction to reversibly configure the resistor in a high-conductance state or low-conductance state, the particular conductance state obtained depending on the polarity of the applied voltage. However, application of voltages greater in magnitude than the voltages used to reversibly configure crossbar-memory junctions can irreversibly destroy the crossbar-memory junctions to which the greater voltages are applied. Each crossbar-memory junction serves as a single-bit memory element, storing a binary value "0" as a low conductance state and a binary value "1" as a high-conductance state.

Although the encoder-demultiplexers and the crossbar memories are similar in that both are implemented using nanoscale crossbars that have configurable resistors at the crossbar junctions, there are important differences between the resistors used in the two subsystems. The resistors in the memory array are used as memory storage elements, and are therefore electronically-reconfigurable. By contrast, the resistors in the encoder-demultiplexers are configured once at the time of manufacturing, and are stable thereafter. However, designers, manufacturers, and users of nanoscale crossbar-memory arrays have recognized a need for crossbar memory arrays with electronically-reconfigurable crossbar resistors at crossbar memory junctions that provide large voltage margins, defect tolerant properties, and can be used with encoder-demultiplexers that use redundant addressing schemes based on error-correcting codes. In addition, designers, manufacturers, and users have recognized a need for methods of writing information to and reading information stored in crossbar memory junctions.

SUMMARY OF THE INVENTION

Various embodiments of the present invention are directed to crossbar-memory systems to methods for writing information to and reading information stored in such systems. In one embodiment of the present invention, a crossbar-memory system comprises a first layer of microscale signal lines, a second layer of microscale signal lines, a first layer of one or more nanowires configured so that each first layer nanowire overlaps each first layer microscale signal line, and a second layer of one or more nanowires configured so that each second layer nanowire overlaps each second layer microscale signal line and overlaps each first layer nanowire. The crossbar-memory system includes nonlinear-tunneling resistors configured to selectively connect first layer nanowires to first layer microscale signal lines and to selectively connect second layer nanowires to second layer microscale signal lines. The crossbar-memory system also includes nonlinear tunneling-hysteretic resistors configured to connect each first layer nanowire to each second layer nanowire at each crossbar intersection.

BRIEF DESCRIPTION OF THE DRAWINGS

FIG. 11 shows a table representing a constant-weight error-control-encoding code.

FIG. 13 illustrates an example crossbar-memory system configured to store and retrieve information that represents a first embodiment of the present invention.

FIG. 20 illustrates applying a write voltage to a selected crossbar memory junction of the crossbar-memory system shown in FIG. 13 that represents an embodiment of the present invention.

FIGS. 24A-24B illustrates changing a conductance state of crossbar memory junctions in the crossbar-memory system shown in FIG. 13 that represents an embodiment of the present invention.

DETAILED DESCRIPTION OF THE INVENTION

Various embodiments of the present invention are directed to crossbar-memory systems and methods for writing information to, and reading information from, the crossbar-memory systems. The crossbar-memory systems comprise a crossbar-memory array with electronically reconfigurable nonlinear-tunneling resistors located at crossbar memory junctions of the crossbar-memory array, switch multiplexers, and two combined microscale/nanoscale demultiplexers that include nonlinear-tunneling resistors located at selected microscale signal line and nanowire junctions. The two combined microscale/nanoscale demultiplexers are designed to use redundant addressing schemes based on error-correcting codes. In order to assist in understanding descriptions of various embodiments of the present invention, an overview of crossbar arrays and crossbar junctions in provided in a first subsection. An overview of properties of nonlinear-tunneling resistors located at crossbar junctions is provided in a second subsection. An overview of nanoscale crossbar-memory arrays is provided in a third subsection. A mathematical description of error-correcting codes is provided in a fourth subsection. Finally, various device embodiments and various writing and reading method embodiments are described in a fifth subsection.

Crossbar Arrays and Crossbar Junctions

Figure 1:
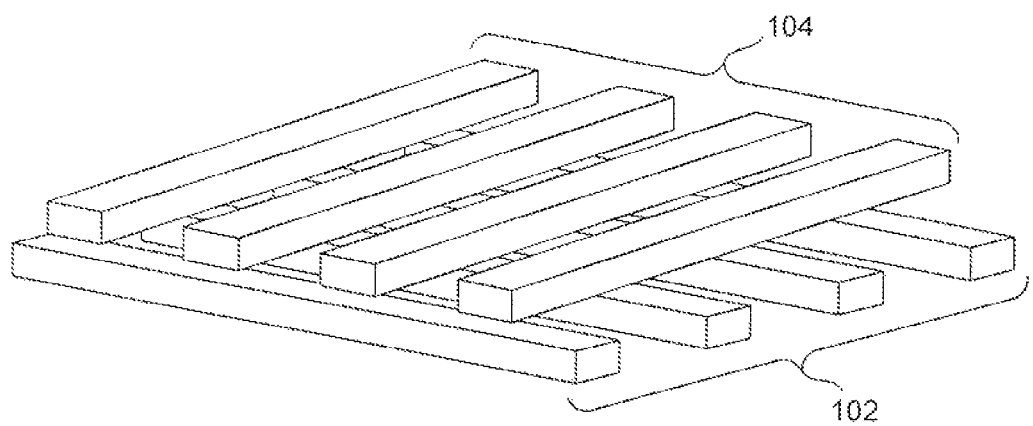
FIG. 1 illustrates a nanowire crossbar array.

FIG. 1 illustrates a nanowire crossbar array. In FIG. 1, a first layer of approximately parallel nanowires 102 is overlain by a second layer of approximately parallel nanowires 104. The second layer 104 is roughly perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102 at nanowire intersections that represent the closest contact between two nanowires. Although individual nanowires in FIG. 1 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

Nanowire layers can be fabricated by mechanical nanoimprinting techniques. Alternatively, nanowires can be chemically synthesized and can be deposited as layers of approximately parallel nanowires in one or more process steps, including Langmuir-Blodgett processes. Other alternative techniques for fabricating nanowires may also be employed. Thus, a two-layer nanowire crossbar comprising first and second layers, as shown in FIG. 1, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

Figure 2A:
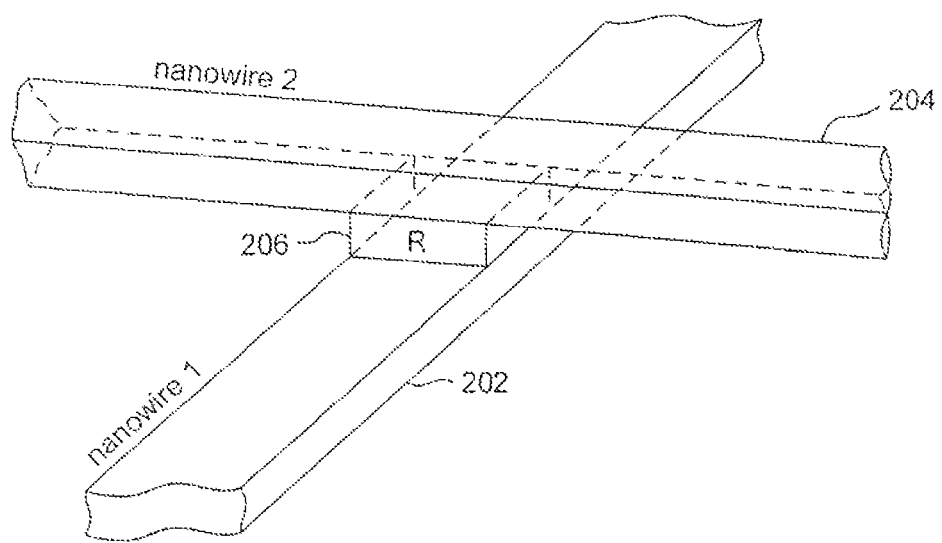
FIGS. 2A-2B illustrate a crossbar junction that interconnects two overlapping nanowires of two contiguous layers within a nanowire crossbar.
Figure 2B:
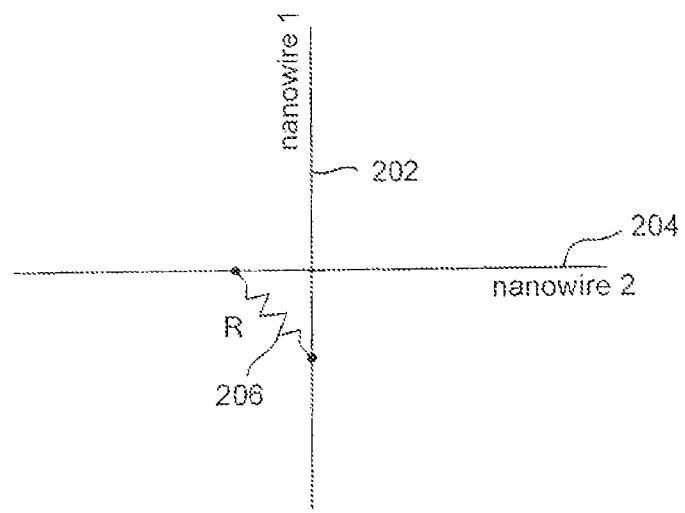

At nanowire intersections, nanoscale electronic components, such as resistors, and other familiar basic electronic components, can be fabricated to interconnect two overlapping nanowires. A nanowire intersection connected by electronic components is called a "crossbar junction." FIGS. 2A-2B provide two different illustrations of a crossbar junction that interconnects nanowires 202 and 204 of two contiguous layers within a nanowire crossbar. The crossbar junction may or may not involve physical contact between the two nanowires 202 and 204. As shown in FIG. 2A, the two nanowires are not in physical contact at their overlap point, but the gap between the nanowires 202 and 204 is spanned by a number of molecules represented by a resistive element 206 that lies between the two nanowires at their closest overlap point. FIG. 2B illustrates a schematic representation of the resistive element 206 and overlapping nanowires 202 and 204 shown in FIG. 2A. The resistive element 206 is used to represent a resistor located at a crossbar junction throughout the remaining figures. The resistive element 206 may represent one or more molecules that behave as a resistor. In certain embodiments of the present invention, the resistive element 206 may be introduced in a separate layer, referred to as "intermediate layer," formed between the layers of overlapping nanowires and configured, as described below with reference to FIGS. 3A-3D.

The electronic properties of crossbar-junction molecules can vary according to the particular molecular configuration or electronic state of the crossbar-junction molecules. In some cases, changes in the state of crossbar-junction molecules may not be reversible. In other cases, the crossbar-junction molecules may be conductive, but the molecules may be irreversibly damaged, along with portions of the nanowires proximal to the crossbar junctions, through application of very high voltages, resulting in disrupting conductivity between the two nanowires and breaking of an electrical connection between them. In yet other cases, the crossbar-junction molecules may transition reversibly from one state to another and back, so that the resistive elements configured at crossbar junctions may be reconfigured, or programmed, by application of differential voltages to selected crossbar junctions.

Various different types of molecules may be introduced at crossbar junctions for a variety of different purposes, such as to control the level of current passing between two overlapping nanowires. The molecules spanning a crossbar junction, as shown in FIG. 2A, may have various different states in which the molecules exhibit resistive, semiconductor-like, or conductive electrical properties. The states, and relative energies of the states, of the crossbar-junction molecules may be controlled by applying differential current levels or voltages to the overlapping nanowires forming the crossbar junction. For example, certain states of a crossbar-junction molecule can be set by applying voltages to nanowires of a crossbar junction. The applied voltages can change the redox state of the crossbar-junction molecule causing the crossbar-junction molecule to operate as a conductor in a reduced state or operate as an insulator in an oxidized state.

Figure 3A:
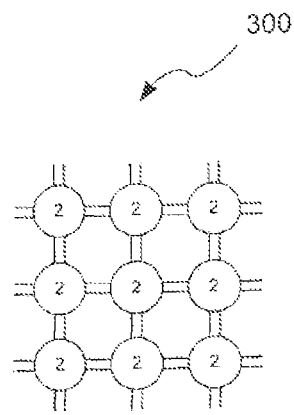
FIGS. 3A-3D illustrate one possible approach to configuring a network of reconfigurable nanoscale electrical components from a two-layer nanowire crossbar.
Figure 3B:
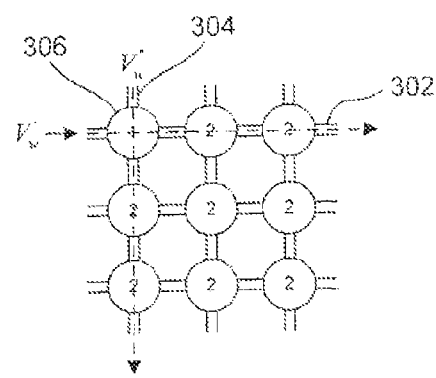
Figure 3C:
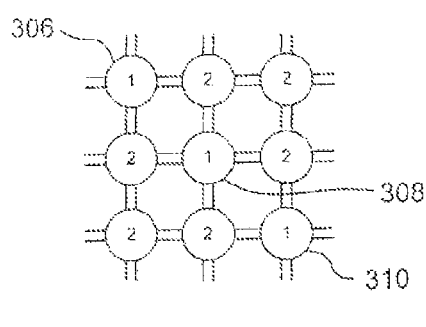
Figure 3D:
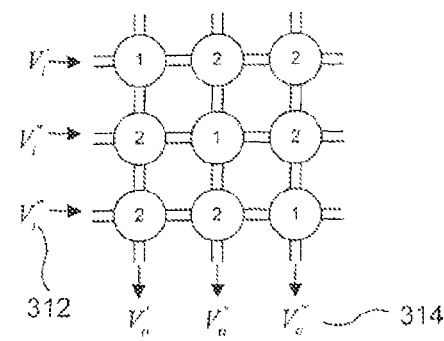

Crossbar junctions can be configured electrically, optically, mechanically or by other means. FIGS. 3A-3D illustrate one possible approach to configuring a network of reconfigurable nanoscale electrical components from a two-layer nanowire crossbar. The example shown in FIGS. 3A-3D are meant to illustrate a general process by which nanowire crossbars may be configured as useful portions of electronic circuits. In FIGS. 3A-3D, a small 3×3 nanowire crossbar is shown, with circles at all nine crossbar junctions, each circle indicating the state of the crossbar-junction molecules. In one state, labeled "1" in FIGS. 3A-3D, the crossbar-junction molecules may have resistive properties, while in a second state, labeled "2" in FIGS. 3A-3D, the crossbar-junction molecules may have different properties that cause the crossbar-junction molecules to operate as insulators. Initially, as shown in FIG. 3A, the states of the crossbar junctions of the nanowire crossbar 300 are labeled "2." Next, as shown in FIG. 3B, each crossbar junction may be uniquely accessed by applying a WRITE voltage, or configuring voltage, to the nanowires that form the crossbar junction in order to configure, or program, the crossbar junction to have the state "1." For example, in FIG. 3B, a first WRITE voltage $v_w'$ is applied to horizontal nanowire 302 and a second WRITE voltage $v_w''$ is applied to vertical nanowire 304 to change the state of the crossbar junction 306 from "2" to "1." Individual crossbar junctions may be configured through steps similar to the steps shown in FIG. 3B, resulting in a fully configured nanoscale component network as shown in FIG. 3C. In FIG. 3C, the states of crossbar junctions 306, 308, and 310 form a downward-slanted diagonal through the nanowire crossbar that have been configured by selective application of WRITE voltages. As shown in FIG. 3D, the nanoscale electrical component network can be used as a portion of an integrated circuit. Input voltages $v_i'$, $v_i''$, and $v_i'''$ may be applied to the nanoscale electrical component lattice as inputs 312 and output voltages $v_o'$, $v_o''$, and $v_o'''$ 314 may be accessed as the result of operation of the nanoscale electrical component network that represents a portion of an integrated circuit. In general, the input voltages $v_i'$, $v_i''$, and $v_i'''$ and the output voltages $v_o'$, $v_o''$, and $v_o'''$ have relatively low magnitudes compared with the WRITE voltages $v_w$. Depending on the types of nanowires, types of dopants employed in the case of semiconductor nanowires, and the types of crossbar-junction molecules employed in the nanowire crossbar, many different configuring processes may be used to configure nanowire crossbars into nanowire-based electrical components networks.

Properties of Nonlinear-Tunneling Resistors at Crossbar Junctions

A current flowing between two overlapping nanowires interconnected by crossbar-junction molecules that operate as a nonlinear tunneling resistor can be modeled by the current-voltage equation:

$$I = \frac{1}{2}(ke^{aV} - ke^{-aV}) = k\sinh(aV)$$

where I is current flowing through the crossbar junction;
  V is a voltage across the crossbar junction;
  k is the quasi-conductance of the crossbar junction; and
  a is a voltage scale factor.

The quasi-conductance, k, and scale factor, a, are parameters determined by the physical properties of crossbar-junction molecules. The scale factor a represents resistive properties of the crossbar junction and can be used to characterize changes in the current flowing through the crossbar junction based on changes in the voltages between the overlapping nanowires. The parameter k is analogous to the conductance, g=1/R, of a linear resistor, where R represents resistance. A nonlinear-tunneling resistor that operates in accordance with the current-voltage equation given above is called a "tunneling resistor."

Figure 4:
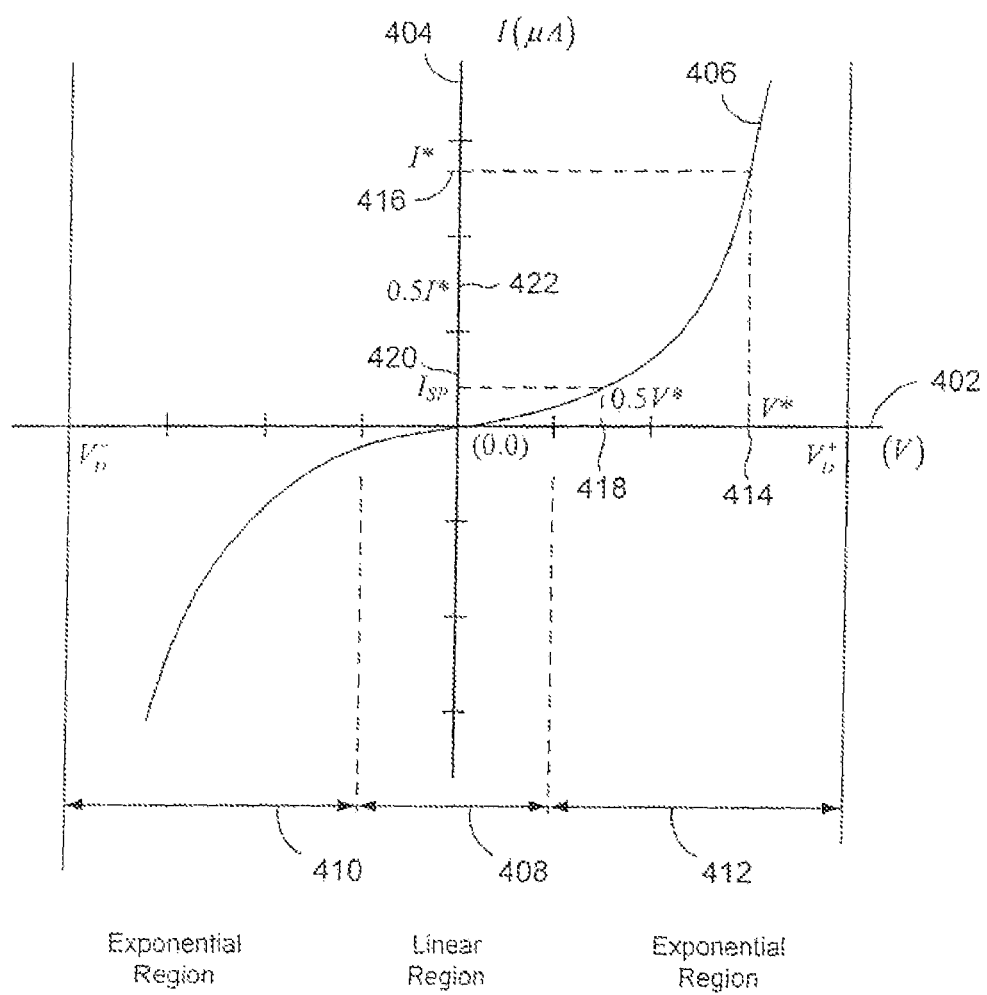
FIG. 4 shows a current-versus-voltage curve that describes the operational characteristics of a nonlinear-tunneling-resistor junction.

FIG. 4 shows a current-versus-voltage curve that represents the operational characteristics of a tunneling resistor located at a crossbar junction. A tunneling resistor located at a nanowire intersection is called a "tunneling-resistor junction." In FIG. 4, and in subsequent FIG. 5, horizontal line 402 represents a voltage axis, and vertical line 404 represents a current axis. The voltage axis 402 is incremented in volts (V), and the current axis 404 is incremented in microamperes (μA). Curve 406 represents the current versus voltage relationship for a tunneling-resistor junction. The curve 406 shows qualitatively different regions of behavior that are identified as a linear region 408, a first exponential region 410, and a second exponential region 412. In the linear region 408, the tunneling-resistor junction operates as a linear resistor junction with an approximate conductance ka. As the magnitude of the voltage across the tunneling-resistor junction decreases to zero, the resistance of the tunneling-resistor junction is nearly constant, and the magnitude of the current flowing through the tunneling-resistor junction decreases to zero. By contrast, in the exponential regions 410 and 412, the curve 406 shows a nonlinear current-versus-voltage relationship. Applying voltages in the exponential regions 410 and 412 decreases the resistance of a tunneling-resistor junction and exponentially increases the conductance, which allows more current to flow through the tunneling-resistor junction. In FIG. 4, voltages $V_D^{--}$ and $V_D^+$ represent the minimum and maximum operating voltages, respectively, that can be applied to the tunneling-resistor junction represented by the curve 406. Applying voltages outside the voltage range $[V_D^-, V_D^+]$ destroys the crossbar junction by irreversibly damaging the tunneling-resistor junction molecules, which destroys the usefulness of the electrical connection between overlapping nanowires and renders the tunneling-resistor junction inoperable through being either permanently open or permanently closed.

One particularly important type of tunneling resistor is a reconfigurable nonlinear-tunneling-hysteretic resistor. Using currently available techniques, reconfigurable nonlinear-tunneling-hysteretic resistors can be fabricated at crossbar junctions to produce reconfigurable tunneling-resistor junctions, called "tunneling-hysteretic-resistor junctions." The resistance of a tunneling-hysteretic-resistor junction can be controlled by applying state-transition voltages that cause the tunneling-hysteretic-resistor junction to alternate between two bistable resistance states. In one resistance state, the tunneling-hysteretic-resistor junction has a relatively low resistance, which corresponds to high-conductance state that is represented by the binary value "1," and in the other resistance state, the crossbar junction has a relatively high resistance, which corresponds to a low-conductance state that is represented by the binary value "0."

Figure 5:
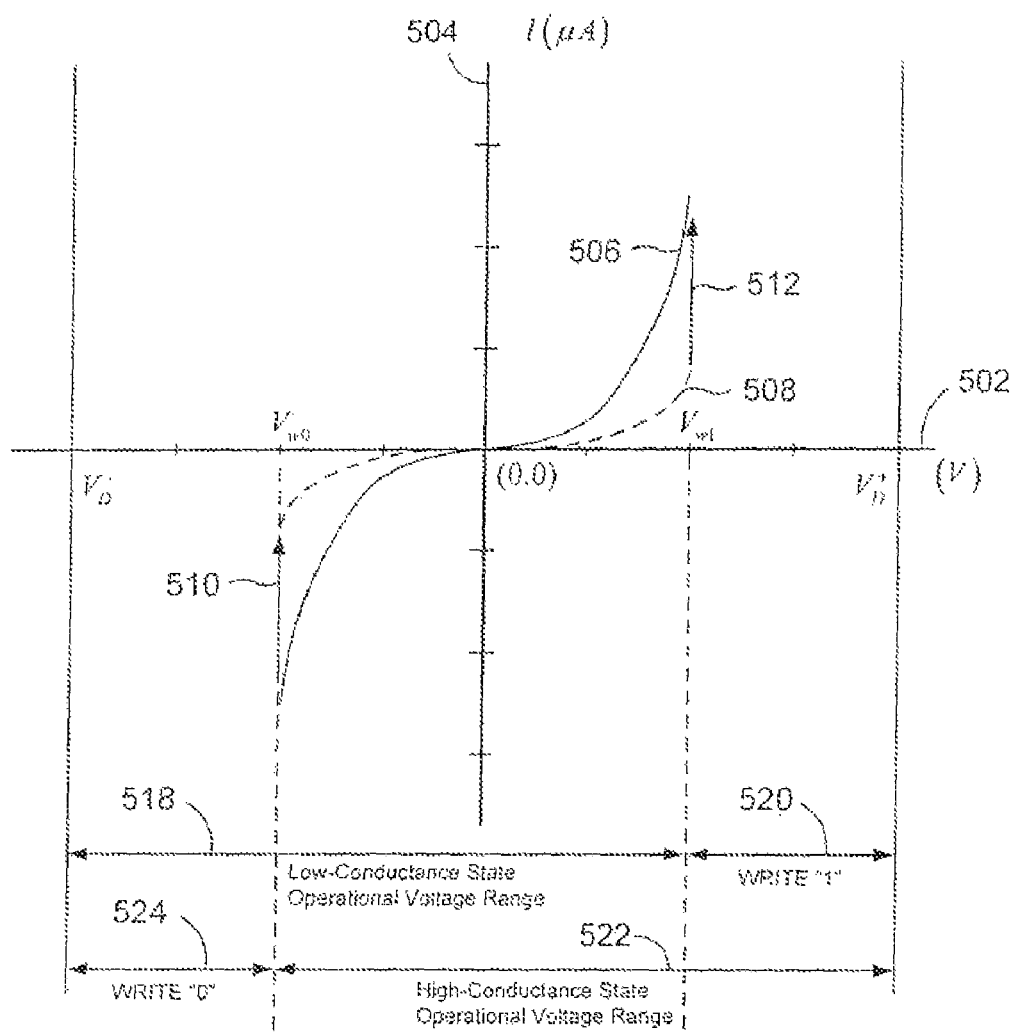
FIG. 5 shows the operational characteristics of a nonlinear-tunneling-hysteretic-resistor junction and resistance-state transitions under operational control voltages.

FIG. 5 shows the operational characteristics of a tunneling-hysteretic-resistor junction and resistance-state transitions under operational control voltages. Curve 506 represents the low-resistance state of the tunneling-hysteretic-resistor junction, and dashed-line curve 508 represents the high-resistance state of the same tunneling-hysteretic-resistor junction. The high-conductance state represented by the curve 506 typically represents a Boolean value or memory state "1," and the low-conductance state represented by the curve 508 typically represents a Boolean value or memory state "0." Applying voltages outside the voltage range $[V_D^-, V_D^+]$ destroys the tunneling-hysteretic-resistor junction. Voltages $V_{w1}$ and $V_{w0}$ represent WRITE "1" and WRITE "0" threshold voltages. When the tunneling-hysteretic-resistor junction is in the low-conductance state 508, applying a voltage in the WRITE "1" voltage range $[V_{w1}, V_D^+]$ 520 causes the tunneling-hysteretic-resistor junction to transition to the high-conductance state 506, as indicated by directional arrow 512. When the tunneling-hysteretic-resistor junction is in the high-conductance state 506, applying a voltage in the WRITE "0" voltage range $[V_D^{-1}, V_{w0}]$ 524 causes the tunneling-hysteretic-resistor junction to transition to the low-conductance state 508, as indicated by directional arrow 510.

The tunneling-hysteretic-resistor junction represented in FIG. 5 can be operated as follows. Consider the tunneling-hysteretic-resistor junction initially in a low-conductance state 508. The tunneling-hysteretic-resistor junction can be operated as a low-conductance state resistor by applying voltages in a voltage range $[V_D^{-1}, V_{w1}]$ 518. However, applying a voltage in the WRITE "1" voltage range 520, causes the tunneling-hysteretic-resistor junction to immediately transition from the low-conductance state 508 to the high-conductance state 506. As a result, the tunneling-hysteretic-resistor junction can now be operated as a high-conductance state resistor by applying voltages in a voltage range $[V_{w0}, V_D^+]$ 522. By applying a voltage in the WRITE "0" voltage range 524, the tunneling-hysteretic-resistor junction transitions from the high-conductance state 506 back to the low-conductance state 508. The change in conductance state of a tunneling-hysteretic-resistor junction may be modeled as a change in the junction's quasiconductance k.

Figure 6A:
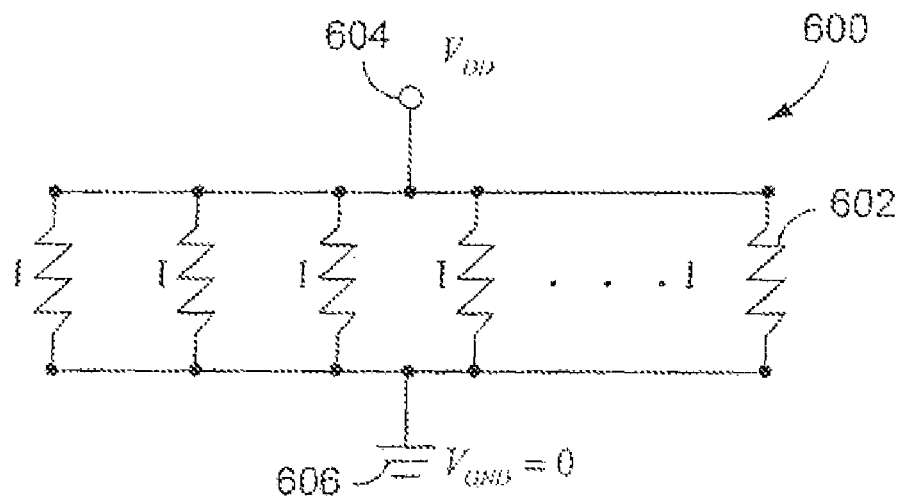
FIG. 6A illustrates a number of parallel nonlinear-tunneling resistors, where each nonlinear tunneling resistor has an identical scale factor and quasi-conductance.

Tunneling resistors have a number of properties in common with linear resistors. For example, the total current flowing through a bundle of η parallel linear resistors, each with an identical conductance g, is the sum of the currents flowing through each resistor, and can be represented by a single linear resistor with a conductance ηg. FIG. 6A illustrates a number of parallel tunneling resistors 600, where each tunneling resistor has an identical scale factor $a_0$ and quasi-conductance $k_0$. In FIG. 6A, each tunneling resistor 602 provides a path for current to flow from source voltage $V_{DD}$ 604 to ground 606. The total current, $I_{total}$, flowing from the source $V_{DD}$ 604 to the ground 606 is evenly divided into η paths, each path carrying the same current I. As a result, the total current flowing through the parallel tunneling resistors 600 is given by:

$$I_{Total} = \eta I = (\eta k_0) \sin h(a_0 V),$$

which shows that the number of parallel tunneling resistors can be represented by a single equivalent tunneling resistor with the scale factor $a_0$ and quasi-conductance $\eta k_0$.

Figure 6B:
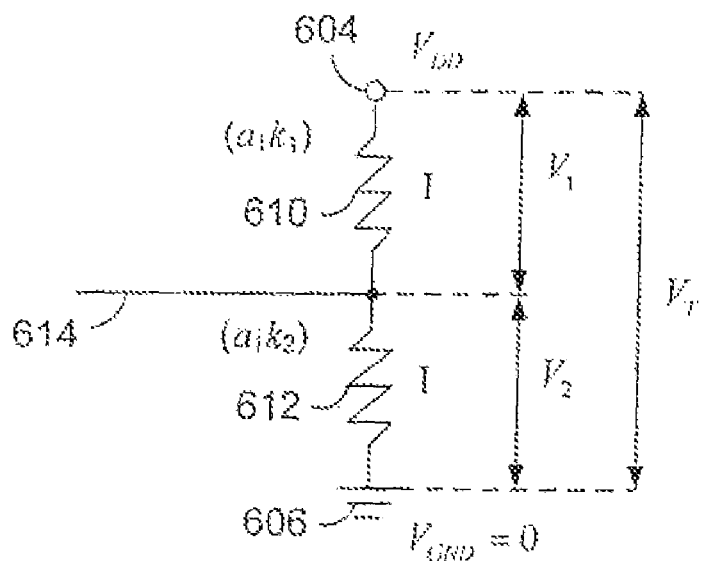
FIG. 6B illustrates a voltage divider composed of two nonlinear-tunneling resistors.

Tunneling resistors can also be connected in series and used to fabricate voltage dividers. FIG. 6B illustrates a voltage divider composed of two tunneling resistors. In FIG. 6B, the top tunneling resistor 610 and the bottom tunneling resistor 612 divide the total voltage between the source 604 and the ground 606 as follows:

$$v_T = v_1 + v_2$$

where $v_1$ is the voltage across the top resistor 610, and $v_2$ is the voltage across the bottom resistor 612. The current flowing through the top tunneling resistor 610 equals the current flowing through the bottom tunneling resistor 612 and is represented by:

$$k_1 \sin h(av_1) = k_2 \sin h(av_2)$$

A wire 614 connected to a wire that connects the top tunneling resistor 610 and the bottom tunneling resistor 612 has a voltage equal to the voltage across the tunneling resistor 610 subtracted from the total voltage, $v_T - v_1$, or, in other words, the voltage across tunneling resistor 612. The voltage carried by the wire 614 is:

$$v_w = \frac{1}{a} \tanh^{-1}\left( \frac{\sinh(av_T)}{\frac{k_2}{k_1} + \sinh(av_T)} \right)$$

where the wire 614 is assumed not to be carrying any load.

The nonlinear properties of the tunneling resistors can be used to amplify a current passing through a selected crossbar junction. For example, two identical linear resistors in a series produce twice the resistance. As a result, the current flowing through each of the linear resistors in the series is half of what would flow if the same voltage V was applied across just one of the linear resistors. In other words, substituting a series pair of linear resistors for a single linear resistor reduces the current by one-half.

By contrast, for nonlinear-tunneling resistors operating in the exponential region, substituting a series pair of identical nonlinear-tunneling resistors for a single nonlinear-tunneling resistor has a different result. Each nonlinear-tunneling resistor in the series carries half the voltage, V/2, which results in a drastic reduction in the current by a factor that depends on the voltage V and the parameters of the tunneling resistor. Consider the nonlinear-tunneling resistor represented by the current-versus-voltage curve 406 shown in FIG. 4. Putting a voltage V* 414 across the nonlinear tunneling resistor produces a current I* 416. However, when two of the same nonlinear-tunneling resistors are substituted in a series for the single nonlinear-tunneling resistor, so that each of the nonlinear tunneling resistors receives half the voltage (0.5V*) 418, the current $I_{SP}$ flows through the series pair, which is due to the nonlinear properties of the nonlinear-tunneling resistor and is considerably smaller than half the current I*, 0.5I* 422. For a numerical example, consider a nonlinear-tunneling resistor with parameters a=3, k=$10^{-8}$. Putting a full 3 V drop across the single nonlinear-tunneling resistor produces a current of 40 µA. By contrast, substituting two of the same nonlinear-tunneling resistors in series for the single nonlinear-tunneling resistor results in each of the nonlinear-tunneling resistors carrying 1.5 V and the current flowing through the series pair is 0.45 µA, which is a reduction of the current by about 2 orders of magnitude.

Nanoscale Crossbar-Memory Arrays

Figure 7:
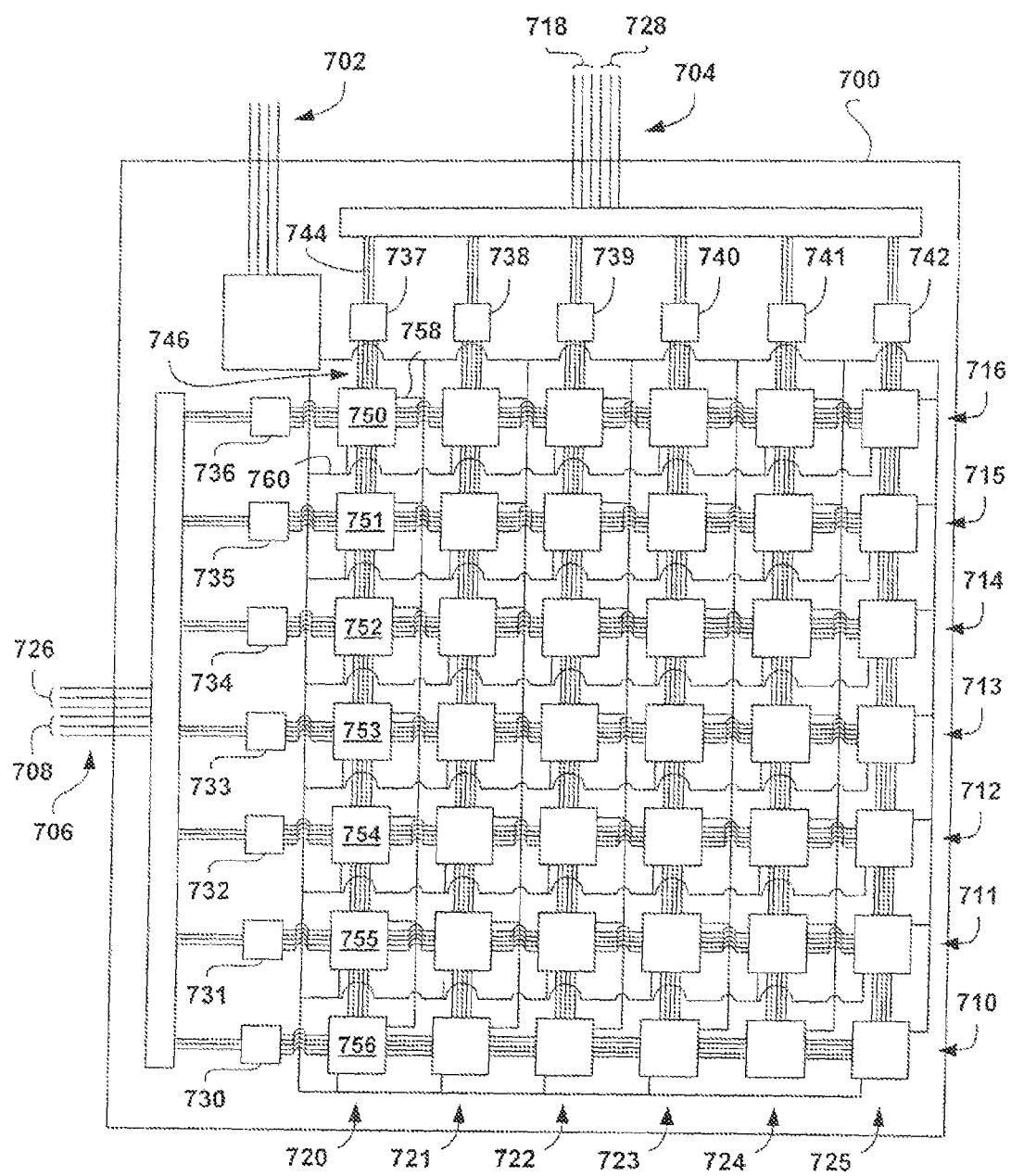
FIG. 7 shows a diagram of a combined nanoscale/microscale electronic memory device.

In the current subsection, a combined microscale/nanoscale electronic memory device is discussed. FIG. 7 shows a diagram of a combined nanoscale/microscale electronic memory device. The combined microscale/nanoscale electronic memory device 700 interfaces to an external electronic environment through reference voltage signal lines 702 and through two sets of address signal lines 704 and 706. The memory elements within the combined microscale/nanoscale electronic memory device 700 can logically be considered to compose a two-dimensional array, with each memory element specified by a pair of coordinates (x,y), where the x coordinate specifies the column of the two-dimensional array inhabited by the memory element and the y coordinate specifies the row of the two-dimensional array inhabited by the memory element. The set of address signal lines 706 may be used to specify one of $2^p$ two-dimensional memory-element-array rows, where p is the number of address signal lines in the set of address signal lines 706, and the set of address signal lines 704 specifies one of $2^q$ columns in the logical, two-dimensional array of memory elements, where q is the number of address signal lines in the set of address signal lines 704. Although the dimensions p and q of the two-dimensional array of memory elements need not be equal, in the following discussion, both dimensions will be assumed to be equal to p, in the interest of notational brevity.

The external sets of address signal lines 704 and 706 are electronically used within the electronic memory device 700 to select a column and row of nanowire-crossbar-memory arrays, and therefore a particular nanowire-crossbar-memory array, and to select a particular row or column within a selected nanowire-crossbar-memory array. For example, in one configuration, the upper three address signal lines 708 of the set of address signal lines 706 may specify one of seven horizontal rows 710-716 of nanowire-crossbar-memory arrays, and the upper three address signal lines 718 of the set of address signal lines 704 may specify one of six vertical columns 720-725 of crossbar-memory systems. The lower three address signal lines 726 in the set of address signal lines. 706 specify a particular row of nanoscale memory elements within a selected crossbar-memory system, and the lower three address signal lines 728 in the set of address signal lines 704 specifies a particular column of nanoscale memory elements within a selected crossbar-memory system. Note that, in general, a larger number of input address signal lines would be employed to address a larger number of columns and rows of crossbar-memory systems than shown in FIG. 7, as well as a larger number of nanoscale-memory-element rows and columns within each crossbar-memory system. The small number of input address lines shown in FIG. 7 is chosen for illustration convenience only.

Each row and column of crossbar-memory systems is accessed through an encoder 730-742. The encoder receives, in FIG. 7, the high-order three input address signal lines and outputs a larger number of microscale signal lines. For example, encoder 737 receives three address signal lines 744 directly interconnected with the high-order input address signal lines 728, and outputs five microscale signal lines 746. The address signal lines output by an encoder pass through all of the crossbar-memory systems within the column or row and are accessed via the encoder. For example, the five microscale signal lines 746 output by the encoder 737 pass through crossbar-memory systems 750-756. Each crossbar-memory system is also connected to two reference voltage signal lines. For example, crossbar-memory system 750 is connected to the reference voltage through reference-voltage signal lines 758 and 760.

The input address signal lines may be microscale address signal lines, or may have even larger dimensions. The microscale signal lines are generally microelectronic or submicroelectronic signal lines and can be produced by currently available photolithographic techniques. The crossbar-memory systems, by contrast, are composed of nanoscale wires, or nanowires. Nanowires have cross-sectional diameters of less than 100 nanometers, while submicroelectronic signal lines have cross-sectional diameters of greater than 100 nanometers. Therefore, there are two nanoscale interconnection interfaces within each crossbar-memory system. In general, the circuitry within the encoders 730-742 is significantly more complex than the circuitry within the crossbar-memory systems. However, each encoder provides access to an entire row or column of crossbar-memory systems, so that only a fraction of the area of an encoder needs to be allocated to any one memory crossbar. As is discussed below, in great detail, defect and fault-tolerant nanoscale interconnection interfaces are facilitated by the supplemental address signal lines output by each encoder.

Figure 8:
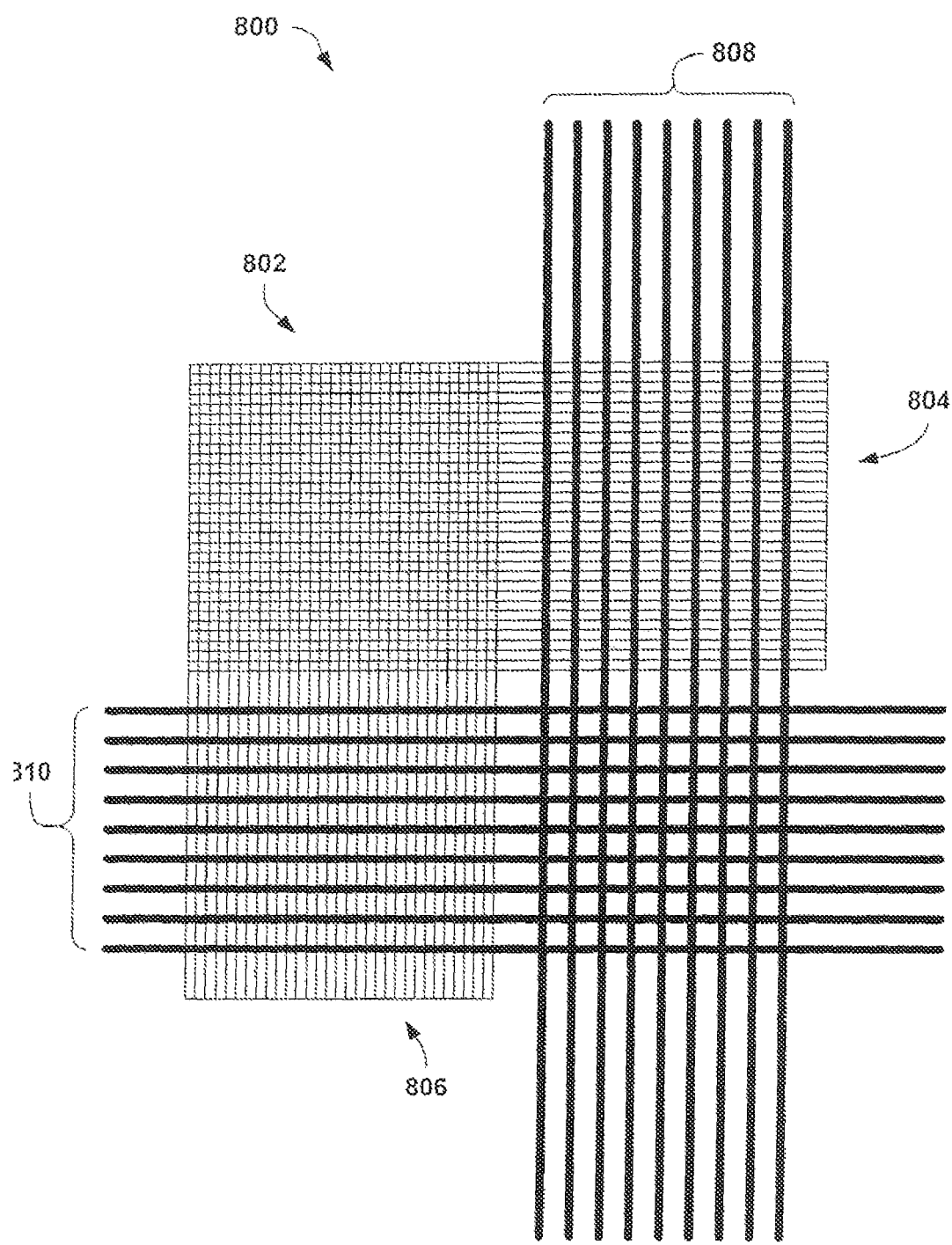
FIG. 8 shows an abstract representation of a nanowire-crossbar memory-element subarray within a combined nanoscale/microscale electronic memory device.

FIG. 8 shows an abstract representation of a crossbar-memory system within a combined nanoscale/microscale electronic memory device. The crossbar-memory system 800 is composed of a nanowire crossbar 802 with a similarly sized region 804 of horizontally extending nanowires and a similarly sized region 806 of vertically extending nanowires. A vertical column 808 of microscale signal lines passes over the region of horizontally extending nanowires 804, with crossbar junctions interconnecting microscale signal lines with particular horizontal extending nanowires. In alternative embodiments of the present invention, resistive ohmic connections, semi-conductor gate connections, or other types of physical methods at nanowire-crossbar junctions may be employed to determine the signals on the nanowires 804. Similarly, a horizontal set 810 of microscale signal lines passes over the region 806 of vertically extending nanowires, with the horizontal microscale address signal lines selectively interconnected via crossbar junctions, to selected vertically extending nanowires. Each unique pattern of ON and OFF voltages, or, equivalently, HIGH and LOW voltages, on the set of vertical internal microelectronic address signal lines 808 uniquely addresses a particular, horizontally extending nanowire, and places that selected nanowire at a significantly different voltage than the remaining horizontally extending nanowires. Similarly, each different pattern of ON and OFF voltages on the set 810 of horizontal internal microelectronic address signal lines selects a unique vertically extending nanowire, and places that selected vertically extending nanowire at a significantly different voltage than the remaining vertically extending nanowires. The selected horizontally extending nanowire and the selected vertically extending nanowire are interconnected at a single overlap point within the nanowire crossbar 802, and the nanowire-crossbar junction at that overlap point is given a different differential voltage drop than all other nanowire-crossbar junctions within the nanowire crossbar via the pattern of ON and OFF voltages present on the set of vertical and horizontal microscale signal lines 808 and 810.

A variety of different types of nanowire crossbars have been designed and prototyped in laboratories around the world. Different types of nanowire crossbars have different chemical and physical properties at the nanowire-crossbar junctions within the nanowire crossbar 802. Initially, significant efforts were directed to developing diode-like nanowire-crossbar junctions that provide good voltage margins and that prevent many undesirable signal paths within a nanowire crossbar. However, diode-like junctions have proven to be difficult to reliably manufacture. Currently, a large effort is being devoted to designing and fabricating nanowire crossbars with tunneling-hysteretic-resistor junctions.

Figure 9:
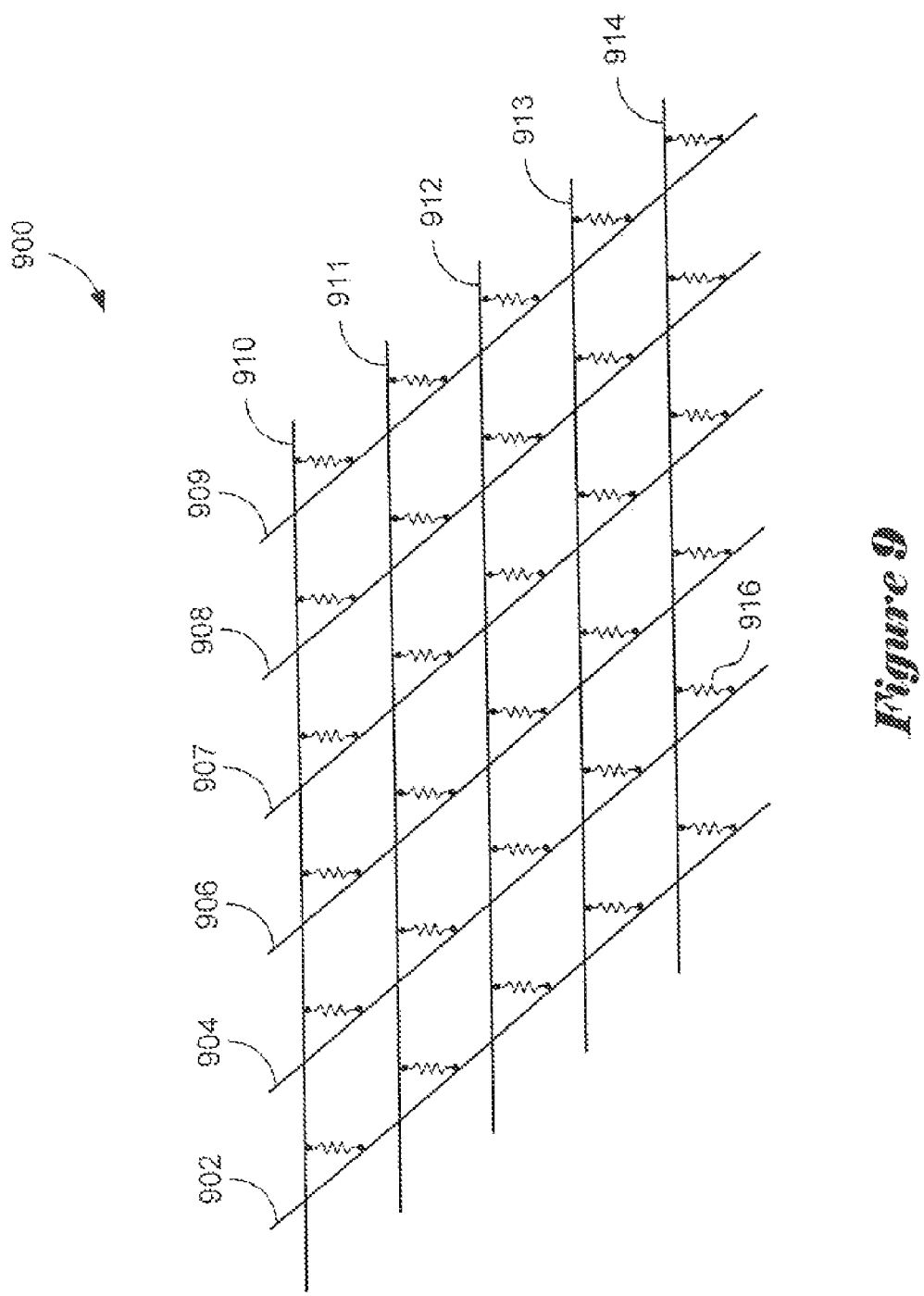
FIG. 9 illustrates a portion of a grid-like nanowire crossbar featuring nonlinear-tunneling-hysteretic-resistor junctions, as described above with reference to FIG. 5.

FIG. 9 illustrates a portion of a grid-like nanowire crossbar 900 featuring tunneling-hysteretic-resistor junctions, as described above with reference to FIG. 5. The nanowire crossbar 900 can be a portion of a crossbar-memory array of a crossbar-memory system. As shown in FIG. 9, the nanowire crossbar comprises a first set of parallel nanowires 902-909 and an overlying, second set of parallel nanowires 910-914 roughly orthogonal to the first set of parallel nanowires 902-909. As shown in FIG. 9, each nanowire of the second set of overlying, parallel nanowires 910-914 is connected to each nanowire of the first set of nanowires 902-909 via a single hysteretic resistor, such as hysteretic resistor 916 interconnecting nanowire 914 with underlying nanowire 904. Each hysteretic resistor has at least two different, stable resistance states. A relatively low-conductance state is arbitrarily assigned the Boolean value or memory state "0," and a relatively high-conductance state is assigned the Boolean value or memory state "1." Thus, each hysteretic-resistor nanowire-crossbar junction, or memory element, can store a single bit of information. The resistance state of a tunneling-hysteretic-resistor junction can be reversibly switched from the low-conductance state to the high-conductane state and from the high-conductance state to the low-conductance state by applying a relatively large voltage across the tunneling-hysteretic-resistor junction, as describe above with reference to FIG. 5.

Figure 10:
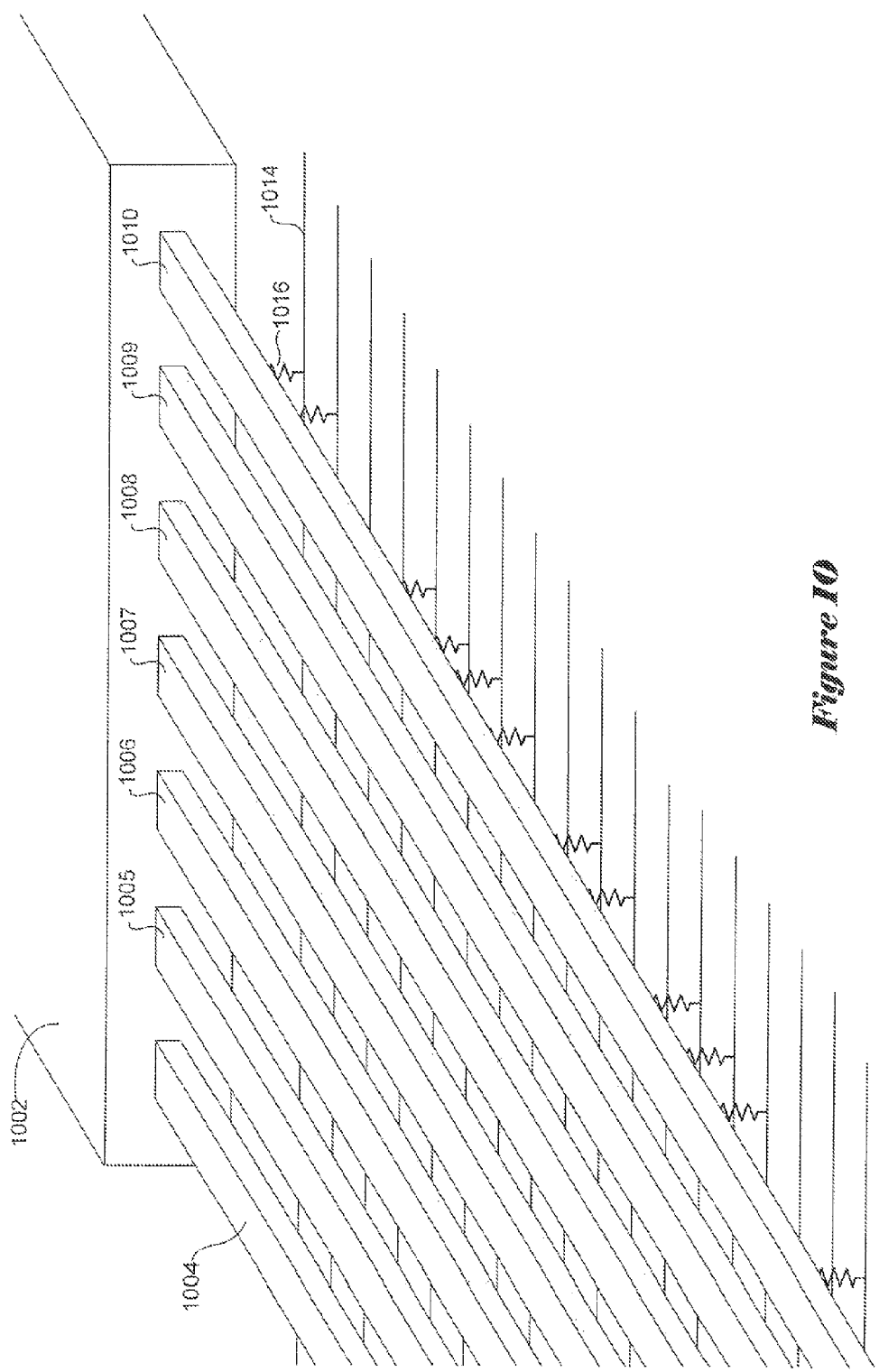
FIG. 10 illustrates a microscale/nanoscale crossbar and encoder of a microscale/nanoscale encoder-demultiplexer.

FIG. 10 illustrates the microscale/nanoscale crossbar and encoder of a microscale/nanoscale encoder-demultiplexer that is used, in combination with another microscale/nanoscale encoder-demultiplexer, to address individual nanowire-crossbar junctions of a nanowire crossbar-memory array in nanoscale-memory-array embodiments of the present invention. The encoder 1002 receives an input address a (not shown in FIG. 10) and outputs a nanowire-selection voltage pattern u on a number of microscale signal lines 1004-1010. The microscale signal lines 1004-1010 are selectively interconnected with nanowires, such as nanowire 1014, through non-linear-tunneling resistors, such as resistive junction 1016, described above with reference to FIG. 4. Unlike in the case of the nanowire crossbar, discussed above with reference to FIG. 9, the resistive microscale/nanoscale junctions of the microscale/nanowire crossbar portion of an encoder-demultiplexer do not need to be reversibly switched between different resistance states. Instead, the pattern of interconnections between microscale signal lines 1004-1010 and nanowires, such as nanowire 1014, result in electronic selection of a single nanowire from among a large number of nanowires that can each be separately addressed by the microscale/nanoscale encoder-demultiplexer. Thus, the nanowire crossbar employed as a nanoscale crossbar-memory array includes nonlinear-tunneling-hysteretic resistors at each junction, the resistance states of which can be reversibly changed in order to store information, while the junctions between microscale output signal lines and nanowires in the microscale/nanoscale crossbar of a microscale/nanoscale encoder-demultiplexer are either manufactured to contain nonlinear-tunneling resistors, manufactured to contain no interconnection, or are stably configured at a time after manufacturing.

Mathematical Description of Selected Error-Control Encoding Techniques

Embodiments of the present invention employ concepts derived from well-known techniques in error-control encoding. This subsection provides background information on error-correcting codes, and may be skipped by those familiar with these topics. An excellent reference for this field is the textbook "Error Control Coding: The Fundamentals and Applications," Lin and Costello, Prentice-Hall, Incorporated, New Jersey, 1983. In this subsection, a brief description of the error-detection and error-correction techniques used in error-control encoding are described. Additional details can be obtained from the above-referenced textbook, or from many other textbooks, papers, and journal articles in this field. The current subsection represents a rather mathematically precise, but concise, description of certain types of error-control encoding techniques. The current invention employs concepts inherent in these error-control encoding techniques for a different purpose.

Error-control encoding techniques systematically introduce supplemental bits or symbols into plain-text messages, or encode plain-text messages using a greater number of bits or symbols than absolutely required, in order to provide information in encoded messages that allows for errors arising in storage or transmission to be detected and, in some cases, corrected. One effect of the supplemental or more-than-absolutely-needed bits or symbols is to increase the distance between valid codewords, when codewords are viewed as vectors in a vector space and the distance between codewords is a metric derived from the vector subtraction of the codewords. The current invention employs concepts used in error-control coding to add supplemental address signal lines to increase the distance between valid addresses in order to correspondingly increase the signal separation, e.g. voltage or current, between ON and OFF states of address signal lines and to provide defective-junction tolerance in interface interconnections. Thus, in the current invention, the plain-text and encoded messages of error-control encoding are analogous to input addresses and coded addresses, and the additional or greater-number-than-needed symbols or bits in error-control encoding are analogous to supplemental or a greater-than-absolutely-needed number of internal address signal lines.

In describing error detection and correction, it is useful to describe the data to be transmitted, stored, and retrieved as one or more messages, where a message μ comprises an ordered sequence of k symbols, $\mu_i$, that are elements of a field F. A message μ can be expressed as:

$$\mu=(\mu_0, \mu_1, \ldots \mu_{k-1})$$

The field F is a set that is closed under multiplication and addition, and that includes multiplicative and additive inverses. It is common, in computational error detection and correction, to employ fields comprising a subset of integers with sizes equal to a prime number, with the addition and multiplication operators defined as modulo addition and modulo multiplication. In practice, a binary field, such as {0,1}, is often employed. The original message is encoded into a message c that also comprises an ordered sequence of n elements of the field F, expressed as follows:

$$c=(c_0, c_1, \ldots c_{n-1})$$

Block encoding techniques encode data in blocks. In this discussion, a block can be viewed as a message μ comprising a fixed number of symbols k that is encoded into a message c comprising an ordered sequence of n symbols. The encoded message c generally contains a greater number of symbols than the original message μ, and therefore n is greater than k. The r extra symbols in the encoded message, where r equals n−k, are used to carry redundant check information to allow for errors that arise during transmission, storage, and retrieval to be detected with an extremely high probability of detection and, in many cases, corrected.

In a linear block code, $2^k$ codewords form a k-dimensional subspace of the vector space of all n-tuples over the field F. The Hamming weight of a codeword is the number of non-zero elements in the codeword, and the Hamming distance between two codewords is the number of elements in which the two codewords differ. For example, consider the following two codewords a and b, assuming elements from the binary field:

$$a=(10011), \text{ and}$$

$$b=(10001)$$

The codeword a has a Hamming weight of 3, the codeword b has a Hamming weight of 2, and the Hamming distance between codewords a and b is 1, since codewords a and b differ only in the fourth element. The distance between the two codewords a and b from the binary field can alternatively be defined using the Hamming weight as:

$$d(a, b)=w(a \text{ XOR } b)$$

where w refers to the Hamming weight of the exclusive OR ("XOR") of codewords a and b, and the Hamming weight can alternatively be computed as the Hamming distance between the codeword and an all-0-bit codeword of the same codeword length. Linear block codes are often designated by a three-element tuple [n, k, $d_{min}$], where n is the codeword length, k is the message length, or, equivalently, the base-2 logarithm of the number of codewords M, and $d_{min}$ is the minimum Hamming distance between different codewords, equal to the minimal-Hamming-weight, non-zero codeword in the code.

The encoding of data for transmission, storage, and retrieval, and subsequent decoding of the encoded data, can be notationally described as follows, when no errors arise during the transmission, storage, and retrieval of the data:

$$\mu \rightarrow c(s) \rightarrow c(r) \rightarrow \mu$$

where c(s) is the encoded message prior to transmission, and c(r) is the initially retrieved or received, message. Thus, an initial message μ is encoded to produce encoded message c(s) which is then transmitted, stored, or transmitted and stored, and is then subsequently retrieved or received as initially received message c(r). When not corrupted, the initially received message c(r) is then decoded to produce the original message μ. As indicated above, when no errors arise, the originally encoded message c(s) is equal to the initially received message c(r), and the initially received message c(r) is straightforwardly decoded, without error correction, to the original message μ.

When errors arise during the transmission, storage, or retrieval of an encoded message, message encoding and decoding can be expressed as follows:

$$\mu(s) \rightarrow c(s) \rightarrow c(r) \rightarrow \mu(r)$$

Thus, as stated above, the final message μ(r) may or may not be equal to the initial message μ(s), depending on the fidelity of the error detection and error correction techniques employed to encode the original message μ(s) and decode or reconstruct the initially received message c(r) to produce the final received message μ(r). Error detection is the process of determining that:

$$c(r) \neq c(s)$$

while error correction is a process that reconstructs the initial, encoded message from a corrupted initially received message:

$$c(r) \rightarrow c(s)$$

The encoding process is a process by which messages, symbolized as μ, are transformed into encoded messages c. Alternatively, a message μ can be considered to be a word comprising an ordered set of symbols from the alphabet consisting of elements of F, and the encoded messages c can be considered to be a codeword also comprising an ordered set of symbols from the alphabet of elements of F. A word μ can be any ordered combination of k symbols selected from the elements of F, while a codeword c is defined as an ordered sequence of n symbols selected from elements of F via the encoding process:

$$\{c: \mu \rightarrow c\}$$

Linear block encoding techniques encode words of length k by considering the word μ to be a vector in a k-dimensional vector space, and multiplying the vector μ by a generator matrix, as follows:

$$c = \mu \cdot G$$

Notationally expanding the symbols in the above equation produces either of the following alternative expressions:

$$(c_0, c_1, \ldots, c_{n-1}) = (\mu_0, \mu_1, \ldots, \mu_{k-1}) \begin{pmatrix} g_{00} & g_{01} & g_{02} & \cdots & g_{0,n-1} \\ \vdots & & \ddots & & \vdots \\ g_{k-1,0} & g_{k-1,1} & g_{k-1,2} & \cdots & g_{k-1,n-1} \end{pmatrix}$$

$$(c_0, c_1, \ldots, c_{n-1}) = (\mu_0, \mu_1, \ldots, \mu_{k-1}) \begin{pmatrix} g_0 \\ g_1 \\ \vdots \\ g_{k-1} \end{pmatrix}$$

where $g_i = (g_{i,0}, g_{i,1}, g_{i,2} \cdots g_{i,n-1})$.

The generator matrix G for a linear block code can have the form:

$$G_{k,n} = \begin{pmatrix} p_{0,0} & p_{0,1} & \cdots & p_{0,r-1} & 1 & 0 & 0 & \ldots & 0 \\ p_{1,0} & p_{1,1} & \cdots & p_{1,r-1} & 0 & 1 & 0 & \ldots & 0 \\ \vdots & \vdots & \cdots & & 0 & 0 & 1 & \ldots & 0 \\ \vdots & \vdots & \cdots & & \vdots & \vdots & \vdots & \ldots & \vdots \\ \vdots & \vdots & \cdots & & \vdots & \vdots & \vdots & \ldots & \vdots \\ p_{k-1,0} & p_{k-1,1} & \cdots & p_{k-1,r-1} & 0 & 0 & 0 & \ldots & 1 \end{pmatrix}$$

or, alternatively:

$$G_{k,n} = [P_{k,r} | I_{k,k}].$$

Thus, the generator matrix G can be placed into a form of a matrix P augmented with a k by k identity matrix $I_{k,k}$. A code generated by a generator in this form is referred to as a "systematic code." When this generator matrix is applied to a word μ, the resulting codeword c has the form:

$$c = (c_0, c_1, \ldots, c_{r-1}, \mu_0, \mu_1, \ldots, \mu_{k-1})$$

where $c_i = (\mu_0 p_{0,i} + \mu_1 p_{1,i}, \ldots, \mu_{k-1} p_{k-1,i})$.

Note that, in this discussion, a convention is employed in which the check symbols precede the message symbols. An alternate convention, in which the check symbols follow the message symbols, may also be used, with the parity-check and identity submatrices within the generator matrix interposed to generate codewords conforming to the alternate convention. Thus, in a systematic linear block code, the codewords comprise r parity-check symbols $c_i$ followed by the symbols comprising the original word μ. When no errors arise, the original word, or message μ, occurs in clear-text form within, and is easily extracted from, the corresponding codeword. The parity-check symbols turn out to be linear combinations of the symbols of the original message, or word μ.

One form of a second, useful matrix is the parity-check matrix defined as:

$$H_{r,n} = [I_{r,r} | -P^T]$$

or, equivalently, $$H_{r,n} = \begin{pmatrix} 1 & 0 & 0 & \ldots & 0 & -p_{0,0} & -p_{1,0} & -p_{2,0} & \cdots & -p_{k-1,0} \\ 0 & 1 & 0 & \ldots & 0 & -p_{0,1} & -p_{1,1} & -p_{2,1} & \cdots & -p_{k-1,1} \\ 0 & 0 & 1 & \ldots & 0 & -p_{0,2} & -p_{1,2} & -p_{2,2} & \cdots & -p_{k-1,2} \\ \vdots & \vdots & \vdots & \ldots & \vdots & \vdots & \vdots & & \vdots \\ 0 & 0 & 0 & \ldots & 1 & -p_{0,r-1} & -p_{1,r-1} & -p_{0,r-1} & \cdots & -p_{k-1,r-1} \end{pmatrix}$$

The parity-check matrix can be used for systematic error detection and error correction. Error detection and correction involves computing a syndrome S from an initially received or retrieved message c(r) as follows:

$$S = (s_0, s_1, \ldots, s_{r-1}) = c(r) \cdot H^T$$

where $H^T$ represents the transpose of the parity-check matrix $H_{r,n}$ expressed as:

$$H^T = \begin{pmatrix} 1 & 0 & 0 & \cdots & 0 \\ 0 & 1 & 0 & \cdots & 0 \\ 0 & 0 & 1 & \cdots & 0 \\ \vdots & \vdots & \vdots & \cdots & 1 \\ -p_{0,0} & -p_{0,1} & -p_{0,2} & \cdots & -p_{0,r-1} \\ -p_{1,0} & -p_{0,1} & -p_{0,2} & \cdots & -p_{0,r-1} \\ -p_{2,0} & -p_{0,1} & -p_{0,2} & \cdots & -p_{0,r-1} \\ \vdots & \vdots & \vdots & \cdots & \vdots \\ -p_{k-1,0} & -p_{k-1,1} & -p_{k-1,2} & \cdots & -p_{k-1,r-1} \end{pmatrix}$$

Note that, when a binary field is employed, x=−x, so the minus signs shown above in $H^T$ are generally not shown.

Hamming codes are linear codes created for error-correction purposes. For any positive integer m greater than or equal to 3, there exists a Hamming code having a codeword length n, a message length k, number of parity-check symbols r, and minimum Hamming distance $d_{min}$ as follows:

$$n = 2^m - 1$$

$$k = 2^m - m - 1$$

$$r = n - k = m$$

$$d_{min} = 3$$

The parity-check matrix for a Hamming Code can be expressed as:

$$H = [I_m | Q]$$

where $I_m$ is an m×m identity matrix and the submatrix Q comprises all $2^m - m - 1$ distinct columns which are m-tuples each having 2 or more non-zero elements. For example, for m=3, a parity-check matrix for a [7,4,3] linear block Hamming code is $$H = \begin{pmatrix} 1 & 0 & 0 & 0 & 1 & 1 & 1 \\ 0 & 1 & 0 & 1 & 1 & 1 & 0 \\ 0 & 0 & 1 & 1 & 0 & 1 & 1 \end{pmatrix}$$

A generator matrix for a Hamming code is given by:

$$G = [Q^T I_{2^m - m - 1}]$$

where $Q^T$ is the transpose of the submartix Q, and $I_{2^m - m - 1}$ is a $(2^m - m - 1) \times (2^m - m - 1)$ identity matrix. By systematically deleting l columns from the parity-check matrix H, a parity-check matrix H' for a shortened Hamming code can generally be obtained, with:

$$n = 2^m - l - 1$$

$$k = 2^m - m - l - 1$$

$$r = n - k = m$$

$$d_{min} \geq 3$$

Other types of codes are employed to increase the Hamming distance between codewords in various applications. Many of these alternative codes do not have the convenient properties of linear block codes, including easy generation using generator matrices, and the transparent, pass-through feature of linear block codes allowing for the encoded value to be directly read from the codeword. For linear block codes, a plain-text message transfers directly to a codeword containing, in addition, parity-check symbols or bits. In other types of codes, the plain-text message is not directly readable in a corresponding codeword. In both cases, codewords contain a greater number of symbols or bits than absolutely needed to enumerate all valid messages to be encoded. In the case of linear block codes, the additional symbols or bits are parity-check symbols or bits that supplement the plain-text symbols or bits, while in the other types of codes, valid messages are distributed throughout a vector space of dimension equal to the codeword size.

Combinatoric codes provide a straightforward approach to increasing the Hamming distance between codewords. To create a combinatoric code (also known as a "constant-weight code" or an "r-hot code"), one may select combinations of r bits having a fixed number of 1's from a total codeword space of n bits to produce $$C_r^n = \frac{n!}{r!(n-r)!}$$

codewords of length n. Of course, one can produce a symmetrical code with an identical number of codewords by choosing combinations of r bits having a fixed number of 0's from a total codeword space of n bits. For example, a combinatoric code including $$C_3^{11} = \frac{11!}{3!(11-3)!} = 165$$

codewords can be obtained by choosing all possible 11-bit codewords with exactly three bits having the value "1." The 165 codewords are provided in the following Table 1:

It is somewhat more complex to encode messages into combinatoric codes, but the logic to do so may be straightforwardly constructed at the logic-circuit level. Combinatoric codes have a guaranteed minimum Hamming distance of 2, and may have significantly better average Hamming distance separations between codewords. For example, in the above $C_3^{11}$ code, the average Hamming distance between codewords is 4.39. Combinatoric codes also have an advantage in producing total signal distinguishability within relatively narrow ranges, since these codes have constant weights, where the weight is defined as the number of bits having the value "1"

Another, similar type of code, referred to as a "random" code, is obtained by choosing random codewords of a fixed length. For example, one can choose a fixed-length, binary, n-bit codeword size, and select a sufficient number of random n-bit binary numbers in order to obtain a desired number of binary codewords $2^k$, where n >Ak. The greater the value of A, the greater the expected minimum Hamming distance between the codewords. When creating random codes, distance checking can be carried out to reject new codewords that have a Hamming distance less than a minimum value with respect to those codewords already selected, and random codewords having approximately equal numbers of "1" and "0" bits can be used in order to obtain an increased average Hamming distance and increased expected minimum Hamming distance.

Yet another type of code that may be employed in the methods and systems of the present invention is a random linear code. In a random linear code, the generator matrix is randomly generated, under linearity constraints, rather than generated as the combination of a parity-check matrix generated from linear sums of information elements that represent parity-check sums, and an identity matrix. A random linear block code is generally not systematic, but linear.

A complementary repeated code that is based on a linear block code, and each codeword is constructed by appending the complement of each codeword in the linear block code to

TABLE 1

| | | | | | |
|---|---|---|---|---|---|
| 11100000000 | 11010000000 | 11001000000 | 11000100000 | 11000010000 | 11000001000 |
| 11000000100 | 11000000010 | 11000000001 | 10110000000 | 10101000000 | 10100100000 |
| 10100010000 | 10100001000 | 10100000100 | 10100000010 | 10100000001 | 10011000000 |
| 10010100000 | 10010010000 | 10010001000 | 10010000100 | 10010000010 | 10010000001 |
| 10001100000 | 10001010000 | 10001001000 | 10001000100 | 10001000010 | 10001000001 |
| 10000110000 | 10000101000 | 10000100100 | 10000100010 | 10000100001 | 10000011000 |
| 10000010100 | 10000010010 | 10000010001 | 10000001100 | 10000001010 | 10000001001 |
| 10000000110 | 10000000101 | 10000000011 | 01110000000 | 01101000000 | 01100100000 |
| 01100010000 | 01100001000 | 01100000100 | 01100000010 | 01100000001 | 01011000000 |
| 01010100000 | 01010010000 | 01010001000 | 01010000100 | 01010000010 | 01010000001 |
| 01001100000 | 01001010000 | 01001001000 | 01001000100 | 01001000010 | 01001000001 |
| 01000110000 | 01000101000 | 01000100100 | 01000100010 | 01000100001 | 01000011000 |
| 01000010100 | 01000010010 | 01000010001 | 01000001100 | 01000001010 | 01000001001 |
| 01000000110 | 01000000101 | 01000000011 | 00111000000 | 00110100000 | 00110010000 |
| 00110001000 | 00110000100 | 00110000010 | 00110000001 | 00101100000 | 00101010000 |
| 00101001000 | 00101000100 | 00101000010 | 00101000001 | 00100110000 | 00100101000 |
| 00100100100 | 00100100010 | 00100100001 | 00100011000 | 00100010100 | 00100010010 |
| 00100010001 | 00100001100 | 00100001010 | 00100001001 | 00100000110 | 00100000101 |
| 00100000011 | 00011100000 | 00011010000 | 00011001000 | 00011000100 | 00011000010 |
| 00011000001 | 00010110000 | 00010101000 | 00010100100 | 00010100010 | 00010100001 |
| 00010011000 | 00010010100 | 00010010010 | 00010010001 | 00010001100 | 00010001010 |
| 00010001001 | 00010000110 | 00010000101 | 00010000011 | 00001110000 | 00001101000 |
| 00001100100 | 00001100010 | 00001100001 | 00001011000 | 00001010100 | 00001010010 |
| 00001010001 | 00001001100 | 00001001010 | 00001001001 | 00001000110 | 00001000101 |
| 00001000011 | 00000111000 | 00000110100 | 00000110010 | 00000110001 | 00000101100 |
| 00000101010 | 00000101001 | 00000100110 | 00000100101 | 00000100011 | 00000011100 |
| 00000011010 | 00000011001 | 00000010110 | 00000010101 | 00000010011 | 00000001110 |
| 00000001101 | 00000001011 | 00000000111 | | | | the codeword. The complementary repeated code generated in this fashion from a [n, k, $d_{min}$] linear code can be used to generate a constant-weight code. A constant-weight code comprises all codewords with the same weight w, represented as (n, M, $d_{min}$, w). Constant-weight codes are a superclass of complementary repeated codes. However, unlike complementary repeated codes, there are generally no simple matrix generators for constant-weight codes, although a certain class of relatively inefficient constant-weight codes can be generated from complementary repeated codes. Constant-weight codes are well-known error-control-encoding codes, and many examples of constant-weight codes with desirable properties have been developed and published.

For the purposes of the current discussion, constant-weight codes can be represented by code tables. FIG. 11 shows a table 1102 representing a constant-weight error-control-encoding code. The table 1102 includes a first column 1104 containing a list of addresses $a_1-a_{m-1}$ and a second column 1106 containing a list of corresponding codewords $u_1-u_{m-1}$. Thus, there is a unique codeword $u_i$ that corresponds to each address $a_i$. In the table 1102, the first five rows 1108 contain addresses and corresponding codewords represented as binary numbers, while the remaining rows show symbolic representations of the addresses and corresponding codewords. The addresses all have a fixed length of q binary digits, and the codewords all have a fixed length of n binary digits. The number of codewords in the constant-weight code is M, or, in other words, the length of the table. In many linear block codes, code sizes are exact powers of two. Constant weight codes, by contrast, are not. Therefore, while $q=\log_2 M$ for many linear block codes, q is generally equal to ceiling ($\log_2 M$) for constant weight codes.

Figures 12A, 12B:
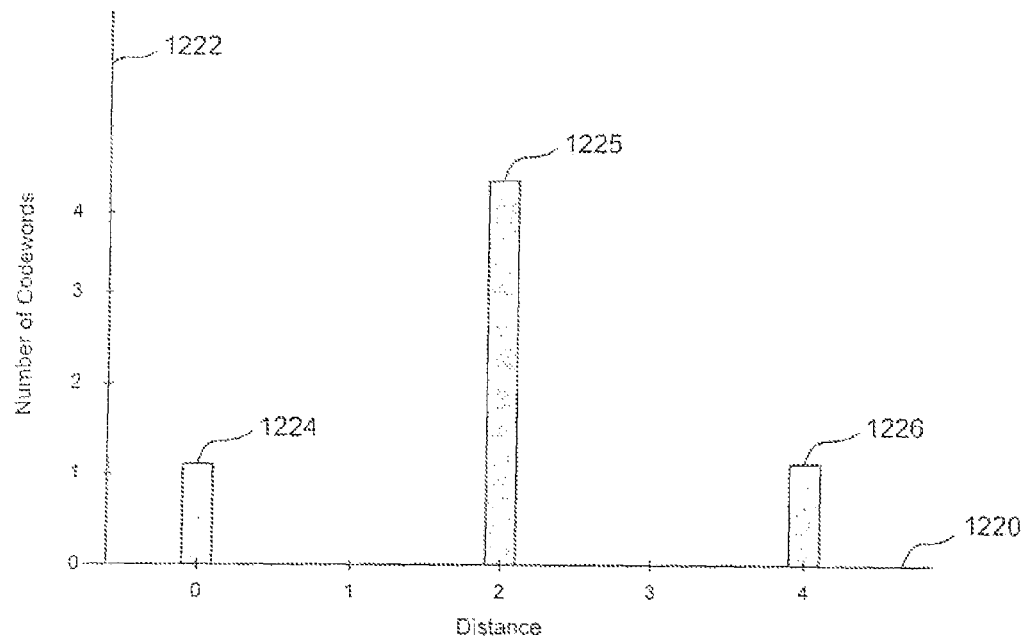
FIGS. 12A-12B illustrate a distance profile and a distance distribution for an example 4-bit constant-weight code.

As will be discussed, below, embodiments of the present invention involve employing constant-weight codes to define nanowire addresses in combined microscale/nanoscale encoder demultiplexers. The voltages on the nanowires can be described in terms of a distance profile and a distance distribution of the code used to address the nanowires. FIGS. 12A-12B illustrate determination of a distance profile and a distance distribution for an example constant-weight code:

(4,6,2,2)={1100,1010,1001,0110,0101,0011}

FIG. 12A shows a table 1200 of distances between all pairs of the codewords. The codewords comprising the constant-weight code (4,6,2,2) are located along the top row 1202 and along the left-most column 1204. Each codeword along the top row 1202 labels a column, and each codeword along the left-most column 1204 labels a row. Each table entry corresponds to an intersection between a column and a row, and the integer value in each table entry is the Hamming distance between the codeword labeling the column and the codeword labeling the row. For example, the Hamming distance between the codeword "1010" 1206 and the codeword "0011" 1208 is "2" at table entry 1210. Note that all of the table entries along the upper-left-hand-to-lower-right-hand diagonal 1212 are "0," because the diagonal table entries correspond to the distance from each codeword to itself. The maximum possible distance between any two codewords is "4," which corresponds to table entries located along the lower-left-hand-to-upper-right-hand diagonal 1214.

The distance profile of a code is a set of distinct distances that can occur between all of the codewords and is represented as a vector d with the distances arranged in ascending order. For example, the distance profile associated with the constant-weight code (4,6,2,2) is:

$$d = \begin{bmatrix} 0 \\ 2 \\ 4 \end{bmatrix}$$

The distance profile includes the distance to all codewords in the code including the distance from a codeword to itself, which is "0."

The distance distribution, represented by a vector m, is the number of codewords in a code at each Hamming distance in the distance profile d from a selected codeword. The selected codeword can be any one of the codewords in the code, and the distance distribution is identical for each selected codeword. This is a property of called "distance invariance" and is true for all linear codes, and for all complementary repeated codes derived from linear codes, and it is true for certain constant-weight codes. FIG. 12B is a distance distribution plot for a selected codeword in the constant-weight code (4,6,2,2). In FIG. 12B, horizontal axis 1220 is the Hamming distance axis, and vertical axis 1222 corresponds to the number of codewords in the constant-weight code (4,6,2,2) at a particular distance from the selected codeword. The columns 1224-1226 corresponds to the number of codewords in the code (4,6,2,2) with Hamming distances "0," "2," and "4" in the distance profile d, respectively, from the selected codeword. For example, consider selected codeword "0011" 1208 labeling the bottom row of the table 1200. The height of the column 1224 is one unit, which corresponds to the one Hamming distance "0" entry in the bottom row of the table 1200. The height of the column 1225 is four units which corresponds to the four Hamming distance "2" entries in the bottom row of the table 1200. The height of the column 1226 is one unit which corresponds to the one Hamming distances with a "4" entry in the bottom row of the table 1200. Note that the distance distribution plot shown in FIG. 12B is the same for each of the codewords in the constant-weight code (4,6, 2,2). The distance distribution of any one of the codewords in the constant-weight code (4,6,2,2) can be represented by a vector:

$$m = \begin{bmatrix} 1 \\ 4 \\ 1 \end{bmatrix}$$

Note that there is a pair wise correspondence between the elements in the distance profile vector d and the elements in the distance distribution vector m. For example, for any selected codeword in (4,6,2,2), such as the codeword "0011," the first element "1" in m corresponds to the first element in d, which means that there is one codeword at a distance equal to "0" from the selected code, the selected codeword itself. The second element "4" in m corresponds to the second element in d, which means that there are four codewords at a distance "2" from the selected codeword, and the third element "1" in m corresponds to the third element in d, which means that there is one codeword at a distance "4" from the selected codeword.

EMBODIMENTS OF THE PRESENT INVENTION

Various crossbar-memory system embodiments of the present invention are described below in section I. Various method embodiments for writing information to crossbar-memory systems are described below in section II, and various method embodiments for reading information from crossbar-memory systems are described below in section III.

Note that, for the sake of simplicity, system and method embodiments of the present invention are described below with reference to example crossbar-memory systems having either a 4×4 or an 8×8 crossbar-memory array. However, system and method embodiments of the present invention are not limited to such crossbar-memory systems. Those skilled in the art will recognize the system and method embodiments of the present invention can include larger crossbar-memory systems, such as crossbar-memory systems with crossbar-memory arrays having $2^k \times 2^k$ nonlinear-tunneling-hysteretic resistors, where k is any positive integer value.

I. Crossbar-Memory Systems

FIG. 13 illustrates an example crossbar-memory system 1300 configured to store and retrieve information that represents a first embodiment of the present invention. The crossbar-memory system 1300 comprises a 9×9 nanowire-crossbar array 1302, a first combined microscale/nanoscale encoder-demultiplexer 1304, and a second combined microscale/nanoscale encoder-demultiplexer 1306. A nonlinear-tunneling-hysteretic resistor (not shown) is located at each crossbar junction of the crossbar array 1302. The crossbar array 1302 includes an 8×8 crossbar-memory array 1308. A column nanowire 1310 and a row nanowire 1312 of the crossbar array 1302 are dedicated to serve as wires in a switched-based row multiplexer ("mux") 1314 and a column mux 1316, respectively, which can both be used to isolate selected crossbar memory junctions of the crossbar-memory array 1308. For example, the row mux 1314 and column mux 1316 can be used isolate a selected crossbar memory junction 1318 so that an unknown memory state of the selected crossbar memory junction 1318 can be READ. The first encoder-demultiplexer 1304 includes an encoder 1320 and a demultiplexer 1322, and the second encoder-demultiplexer 1306 includes an encoder 1324 and a demultiplexer 1326. Both demultiplexers 1322 and 1326 have a set of roughly parallel microscale signal lines connected to the encoders 1320 and 1324 that overlap the nanowires comprising the crossbar array 1302. Nonlinear-tunneling resistors (not shown) are located at selected crossbar junctions of the demultiplexers 1322 and 1326. The crossbar-memory system 1300 also includes a first microscale wire 1328 and a second microscale wire 1330. The first microscale wire 1328 is connected to an voltage source 1332 at one end and the row nanowire 1312 at a crossbar junction 1334, and the second microscale wire 1330 is connected to the column nanowire 1310 at the crossbar junction 1336 and to a meter 1338 and ground 1340. Both of the crossbar junctions 1334 and 1336 are nonlinear-tunneling resistor junctions in a high-conductance state. The meter 1338 represents a current measurement circuit which measures and records the current carried by the wire 1330. The crossbar junction 1342 is in a low-conductance state.

Figure 14:
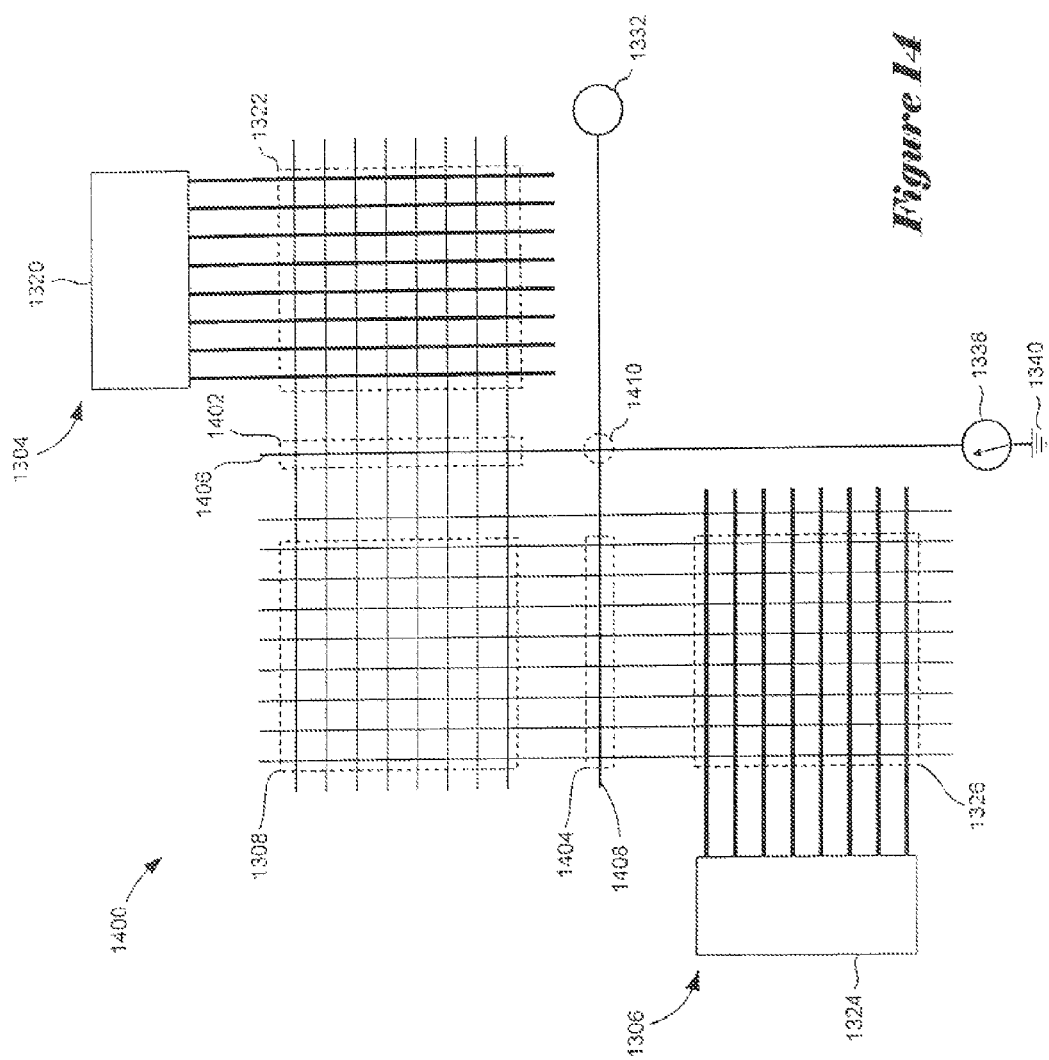
FIG. 14 illustrates an example configuration of a crossbar-memory system that is structurally similar to the crossbar-memory system shown in FIG. 13 and represents a second embodiment of the present invention.

In alternate embodiments of the present invention, the column mux and row mux may be separated spatially from the crossbar array and can be made with wires having cross-sectional dimensions ranging from the nanoscale to microscale in order to lower the impedance. In addition, the a and k parameters of the nonlinear-tunneling-hysteretic resistors connecting the overlapping row and column nanowires of the crossbar-memory array can be different from the a and k parameters of the nonlinear-tunneling-hysteretic resistors connecting the row and column wires in the row and column muxes. FIG. 14 illustrates an example configuration of a crossbar-memory system 1400 that is structurally similar to the crossbar-memory system 1300 shown in FIG. 13 and represents a second embodiment of the present invention. In the interest of brevity, structurally identical components in both of the crossbar-memory systems 1300 and 1400 have been provided with the same reference numerals and an explanation of their structure and function is not repeated. As shown in FIG. 14, the crossbar-memory system 1400 includes a row mux 1402 and a column mux 1404, which, in contrast to the crossbar-memory system 1300, are separated spatially from the crossbar-memory array 1308. The row mux 1402 includes a wire 1406, which is connected to each row nanowire of the crossbar-memory array 1308 by nonlinear-tunneling-hysteretic resistors, and the column mux 1404 includes a wire 1408, which is connected to each of the column nanowires of the crossbar-memory array 1308 by nonlinear-tunneling-hysteretic resistors. The wire 1406 is connected directly to the voltage source 1332, and the wire 1406 is connected directly to the meter 1338. The cross-sectional dimensions of the wires 1406 and 1408 can range from the nanoscale to the microscale or larger, and the nonlinear-tunneling-hysteretic resistors of the row and column muxes 1402 and 1404 can be different from the nonlinear-tunneling-hysteretic resistors of the crossbar-memory array 1308. A crossbar junction 1410 connecting the wires 1406 and 1408 is in a low-conductance state or may be constructed in a permanent non-conducting state.

For the sake of brevity and simplicity, a description of addressing nanowires of a crossbar-memory array using a particular constant-weight error-correcting code is provided below with reference to FIGS. 15-17, and a description of determining voltages output on nanowires of an encoder-demultiplexer is described with reference to FIGS. 18-19. Note that the present invention is not limited to the use of constant-weight codes to address nanowires of an encoder-demultiplexer. Those skilled in the art will recognize that other types of error-correcting codes, in addition to numerous different types of constant-weight codes, can also be used to address the nanowires of larger dimensioned encoder-demultiplexer.

Figure 15:
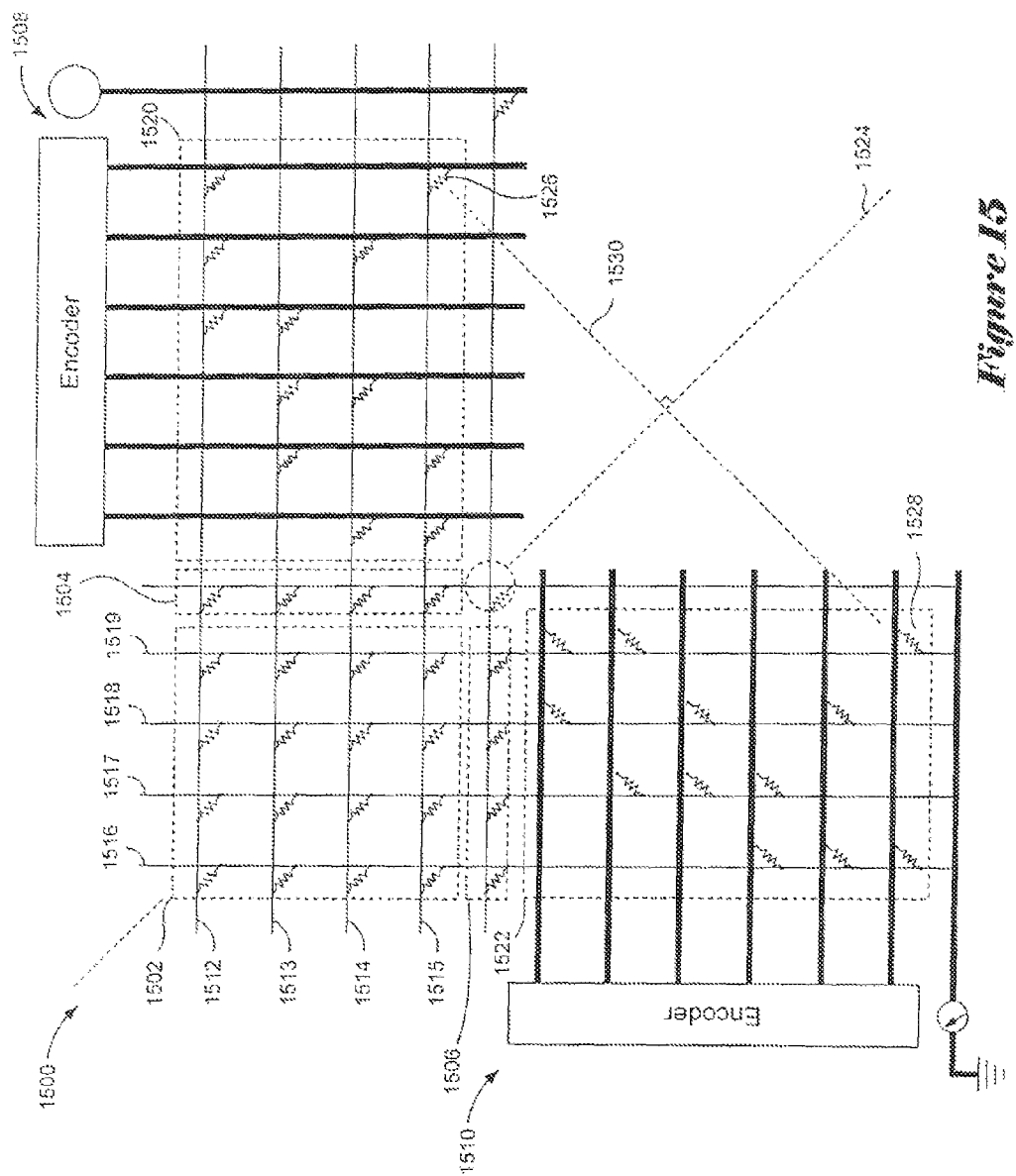
FIG. 15 illustrates an example crossbar-memory system that represents an embodiment of the present invention.

FIG. 15 illustrates an example crossbar-memory system 1500 that represents an embodiment of the present invention. The crossbar-memory system 1500 includes a 4×4 crossbar-memory array 1502, a row mux 1504, a column mux 1506, a first combined microscale/nanoscale encoder-demultiplexer 1508, and a second combined microscale/nanoscale encoder-demultiplexer 1510. The crossbar-memory array 1504 comprises a set of nearly parallel row nanowires 1512-1515 that overlap a set of nearly parallel column nanowires 1516-1519. Nonlinear-tunneling-hysteretic resistors are located at each crossbar memory junction of the crossbar-memory array 1504, and nonlinear-tunneling resistors are located at selected crossbar junctions of demultiplexers 1520 and 1522. The pattern of crossbar junctions in the demultiplexers 1520 and 1522 are mirror images of one another. The mirror images of the pattern of the crossbar junctions in the demultiplexers 1520 and 1522 can be thought of as follows. Consider an imaginary line of symmetry 1524 that bisects the crossbar-memory system 1500. In order to obtain a mirror image of a crossbar junction in the demultiplexer 1520, first move the crossbar junction a distance to the line of symmetry 1524 along a line that is perpendicular to, and intersects, the line of symmetry 1524. Then move the crossbar junction the same distance along the perpendicular line to a point on the opposite side of the line of symmetry 1524. For example, the crossbar junctions 1526 and 1528 are on opposite sides of the line of symmetry 1524. The crossbar junctions 1526 and 1528 are located the same distance from the line of symmetry 1524 along a line 1530, which is perpendicular to and intersects the line of symmetry 1524. Arranging the nonlinear-tunneling resistors of the demultiplexers as mirror images of one another is needed for writing bit "0" and bit "1" to crossbar memory junctions of the crossbar-memory array, which is described below with reference to FIGS. 20-22. Note that although the demultiplexers 1520 and 1522 are mirror images of one another, the configuration of nonlinear-tunneling resistors in the demultiplexers 1520 and 1522 are based on the same constant weight code.

Figure 16:
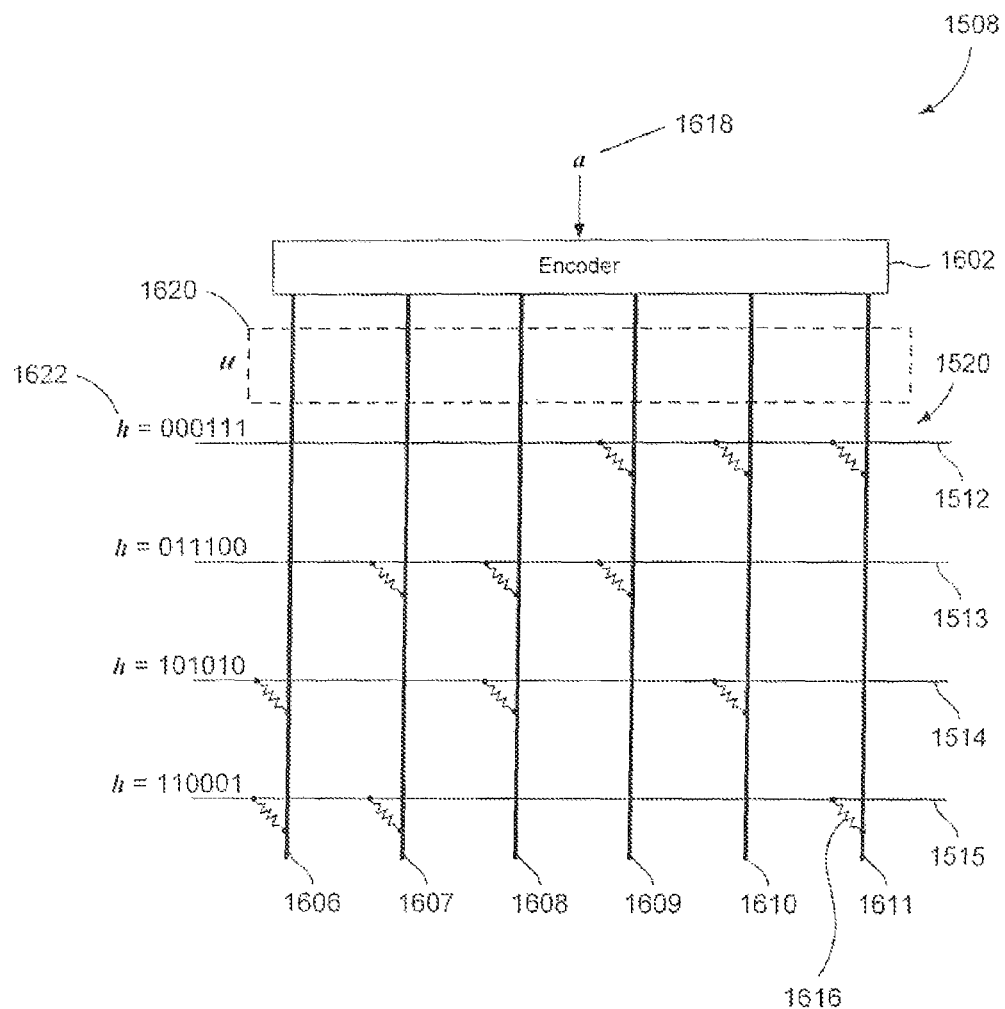
FIG. 16 illustrates an enlargement of a microscale/nanoscale encoder-demultiplexer shown in FIG. 15 that represents an embodiment of the present invention.

FIG. 16 illustrates an enlargement of the microscale/nanoscale encoder-demultiplexer 1508 that represents an embodiment of the present invention. The encoder-demultiplexer 1508 includes the demultiplexer 1520 and an encoder 1602. The demultiplexer 1520 comprises a set of microscale signal lines 1606-1611 that are selectively interconnected to the nanowires 1512-1515 at crossbar junctions with nonlinear-tunneling resistors, such as nonlinear-tunneling resistor 1616. The crossbar junctions are arranged in a pattern to address the nanowires 1512-1515 in accordance with a (6,4,4,3) constant-weight code comprising the codewords 000111, 011100, 101010, and 110001 with a distance profile d=[0 4], a distance distribution m=[1 3], and a Hamming weight w equal to 3. The encoder 1604 receives a nanowire addresses a 1618 and outputs a corresponding pattern of high and low voltages, or a pattern of oppositely polarized voltages, onto the microscale signal lines 1606-1611. The pattern of voltages output on the microscale signal lines 1606-1611 from the encoder 1602 is in accordance with the same constant-weight code (6,4,4,3) and is represented by a codeword u 1620. A pattern of voltages output from the encoder 1604 results in a number of different voltages output from the nanowires 1512-1515.

The nanowire with an address h that matches the codeword u carries the highest voltage output and is called a "selected nanowire." The remaining nanowires are called "non-selected nanowires." The address h of each nanowire corresponds to the pattern of tunneling-resistor junctions interconnecting the nanowire to the microscale signal lines 1606-1611. The address of a nanowire can be read by starting from the leftmost microscale signal line, advancing to the right most microscale signal line, and representing each crossbar junction that includes a tunneling resistor by the binary value "1" and representing each crossbar junction that does not include a tunneling resistor by the binary value "0." For example, the address of the nanowire 1512 is determined by starting from the left most microscale signal line 1606 and advancing toward the right most microscale signal line 1611, which reveals the pattern of tunneling-resistor junctions "0," "0," "0," "1," "1," and "1." Thus, the address h 1622 of the nanowire 1512 is "000111."

Figure 17A:
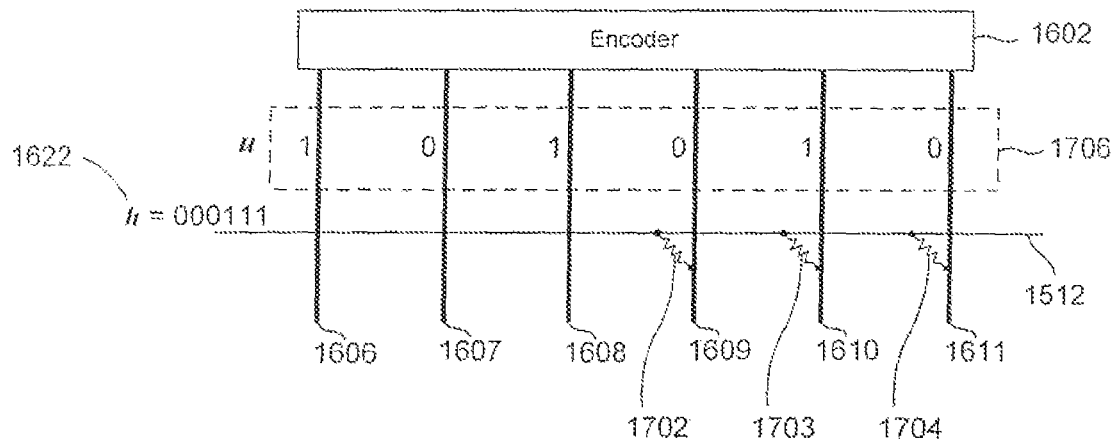
FIGS. 17A-17B illustrate an example of a voltage-divider representation of a nanowire of the encoder-demultiplexer shown in FIG. 16 that represents an embodiment of the present invention.
Figure 17B:
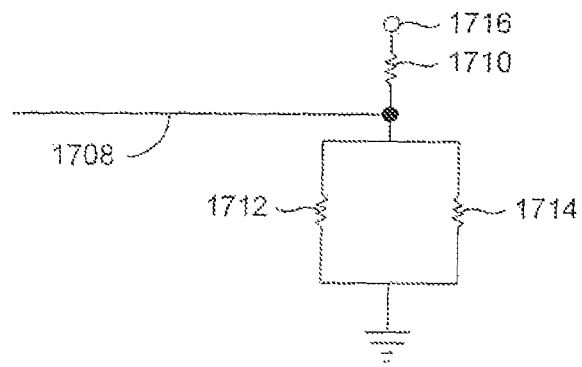

The voltage output from a nanowire receiving a pattern of voltages results from a voltage-divider effect, as described above with reference to FIGS. 6A-6B. FIGS. 17A-17B illustrate an example of a voltage-divider representation of the nanowire 1512 receiving voltages from the encoder 1604, in FIG. 16, that represents an embodiment of the present invention. FIG. 17A illustrates the nanowire 1512 of the encoder-demultiplexer 1508 interconnected to three microscale signal lines 1509-1511 via tunneling-resistor junctions 1702-1704. In FIG. 17A, a codeword u 1706 represents a pattern of voltages output by the encoder 1602 to the microscale signal lines 1606-1611. The voltage corresponding to the binary value "1" may be considered to be a source voltage, and the voltage corresponding to the binary value "0" may be considered to be a ground or a voltage sink. For example, the binary value "1" can correspond to a voltage 2V, and the binary value "0" can correspond to ground 0V or to a voltage sink at a relative voltage of –2 V.

FIG. 17B illustrates a schematic voltage-divider representation of the nanowire 1512 of microscale/nanoscale demultiplexer shown in FIG. 17A. In FIG. 17B, line 1708 represents nanowire 1512, upper resistor 1710 represents the tunneling-resistor junction 1703 that carries a voltage corresponding to the binary value "1," and lower resistors 1712 and 1714 represent the tunneling-resistor junctions 1702 and 1704, both of which carry voltages corresponding to the binary value "0." Open circle 1716 represents a voltage source. A schematic voltage-divider representation of a nanowire interconnected to a number of microscale signal lines can be used to determine the voltage output from the nanowire.

Figure 18A:
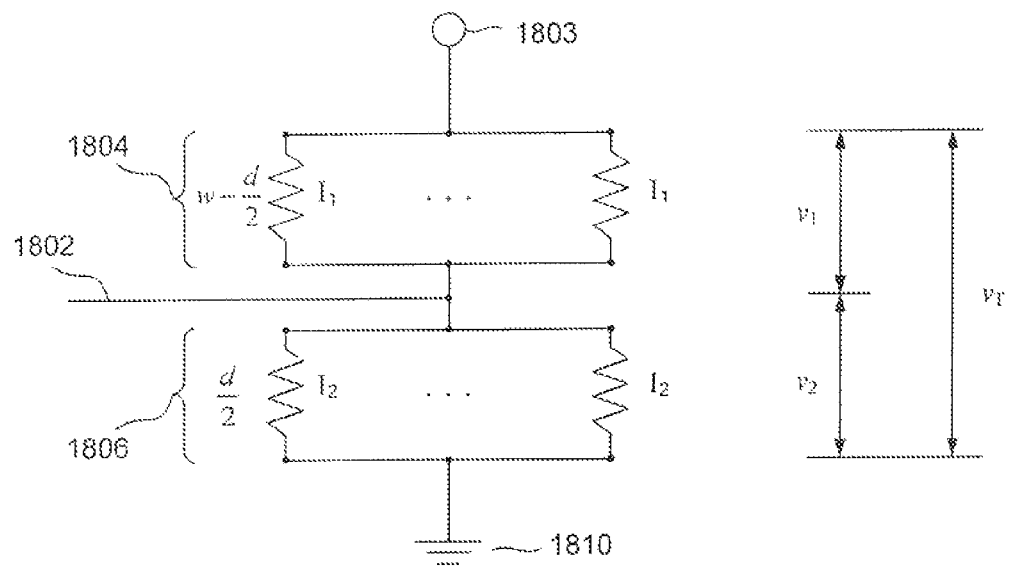
FIGS. 18A-18B show a general voltage-divider representation of a nanowire interconnected to a number of microscale signal lines of an encoder demultiplexer that represents an embodiments of the present invention.
Figure 18B:
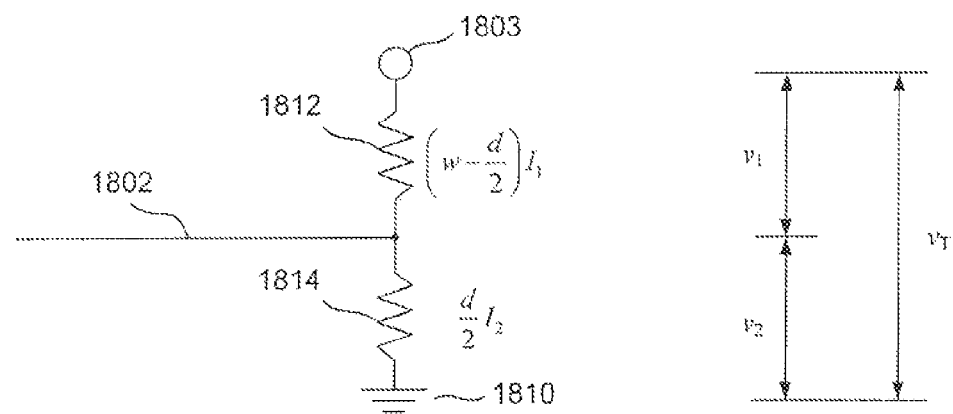

FIGS. 18A-18B show a general voltage-divider representation of a nanowire interconnected to a number of microscale signal lines of an encoder demultiplexer that can be used to determine voltages output from a nanowire and that represents one of many embodiments of the present invention. In FIG. 18A, line 1802 represents an encoder-demultiplexer nanowire. The resistors in the upper set of parallel resistors 1804 represent tunneling-resistor junctions that interconnect the nanowire 1802 to microscale signal lines that each carry a voltage corresponding to the binary value "1," and the resistors in the lower set of parallel resistors 1806 represent tunneling-resistor junctions that interconnect the nanowire 1802 to microscale signal lines that each carry a voltage corresponding to the binary value "0." The tunneling resistors in both the upper and the lower sets have identical a and k parameters. The number of resistors in the upper and lower sets of parallel resistors 1804 and 1806 are:

$$w - \frac{d}{2}, \text{ and } \frac{d}{2}$$

respectively, where
w is the weight of the codeword u and the codeword h, and
d is the distance between h and u.

Note that the distance is an even when h and u are codewords of constant-weight code. As described above with reference to FIG. 6A, the total current flowing through the upper set of parallel resistors 1804 is $(w-d/2)I_1$, where $I_1$ is the current flowing through each resistor in the upper set of parallel resistors 1804, and the total current flowing through the lower set of parallel resistors 1806 is $(d/2)I_2$, where $I_2$ is the current flowing through each resistor in the lower set of parallel resistors 1806. The total voltage, $v_T$, between voltage source 1808 and ground 1810 equals the sum of voltages across both sets of parallel resistors 1804 and 1806 and is given by:

$$v_T = v_1 + v_2$$

where
$v_1$ is the voltage across the upper set of parallel resistors 1804, and
$v_2$ is the voltage across the lower set of parallel resistors 1806.

The upper set of parallel resistors 1804 and the lower set of parallel resistors 1806 both operate as a single resistor. As a result, the upper set of parallel resistors 1804 and the lower set of parallel resistors 1806 can both be represented by a single resistor called a resistor "bundle." FIG. 18B shows resistor bundle representations 1812 and 1814 of the upper set of parallel resistors 1804 and the lower set of parallel resistors 1806, respectively. The bundled voltage-divider representations in FIG. 18B can be used to determine the voltage output on the nanowire 1802 as follows. According to Kirchoff's Current Law, because the resistor bundles 1812 and 1814 are in a series, and because nanowire 1802 is assumed to be carrying no current, the current flowing through the resistor bundle 1812 equals the current flowing through the resistor bundle 1814, which is represented by a current equation:

$$\left(w - \frac{d}{2}\right)I_1 = \frac{d}{2}I_2$$

Since the resistors comprising the upper and lower resistor bundles 1812 and 1814 are identical tunneling resistors, the tunneling resistor current-versus-voltage relationships:

$I_1 = k \sin h(av_1)$, and $I_2 = k \sin h(av_2)$ can be substituted into the current equation above to obtain:

$$\left(w - \frac{d}{2}\right)k\sinh(a(v_T - v_2)) = \frac{d}{2}k\sinh(av_2)$$

where $v_1 = v_T - v_2$.

Solving for the voltage $v_2$ gives the voltage output from the nanowire 1802:

$$v_{h,a} = \frac{1}{a}\tanh^{-1}\left(\frac{\sinh(av_T)}{\frac{d}{2w-d} + \cosh(av_T)}\right)$$

Note that the demultiplexer nanowire output voltage $v_{h,a}$ is independent of the parameter k.

Figure 19A:
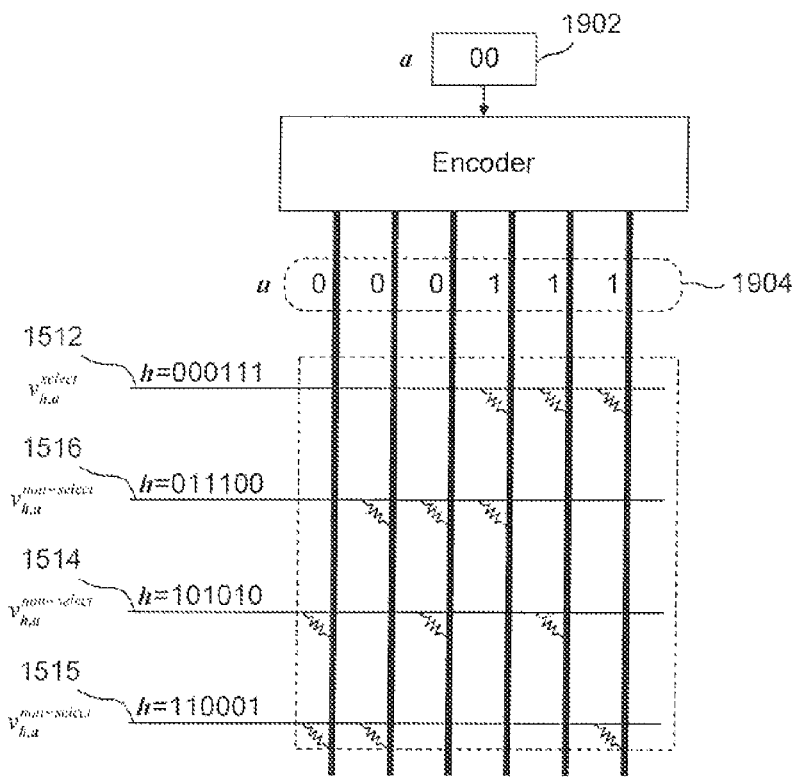
FIGS. 19A-19D show voltage outputs from nanowires of an encoder demultiplexer employing tunneling-resistor junctions that represents one of many embodiments of the present invention.

FIGS. 19A-19D show voltage outputs from nanowires of an encoder demultiplexer employing tunneling-resistor junctions that represents one of many embodiments of the present invention. In FIG. 19A, input address a "00" 1902 is input to the encoder 1404, which outputs the codeword u "000111" 1904 that corresponds to the address h of the nanowire 1304, in FIG. 14. The pattern of voltages output on the four nanowires of the encoder demultiplexers corresponds to the Hamming distances in the distance profile d=[0 4] described above. For example, in FIG. 19A, the selected nanowire 1304 corresponds to the Hamming distance "0" in the distance profile d and all three of the non-selected nanowires 1305-1307 correspond to the Hamming distance "4" in the distance profile d. As a result, according to $v_{h,a}$ above, the voltage output on the selected nanowire 1312 is:

$$v_{h,a}^{(s)} = \frac{1}{a}\tanh^{-1}\left(\frac{\sinh(av_T)}{\cosh(av_T)}\right)$$

The voltage output on the remaining non-selected nanowires 1305-1307 is:

$$v_{h,a}^{(ns)} = \frac{1}{a}\tanh^{-1}\left(\frac{\sinh(av_T)}{2+\cosh(av_T)}\right)$$

Figure 19B:
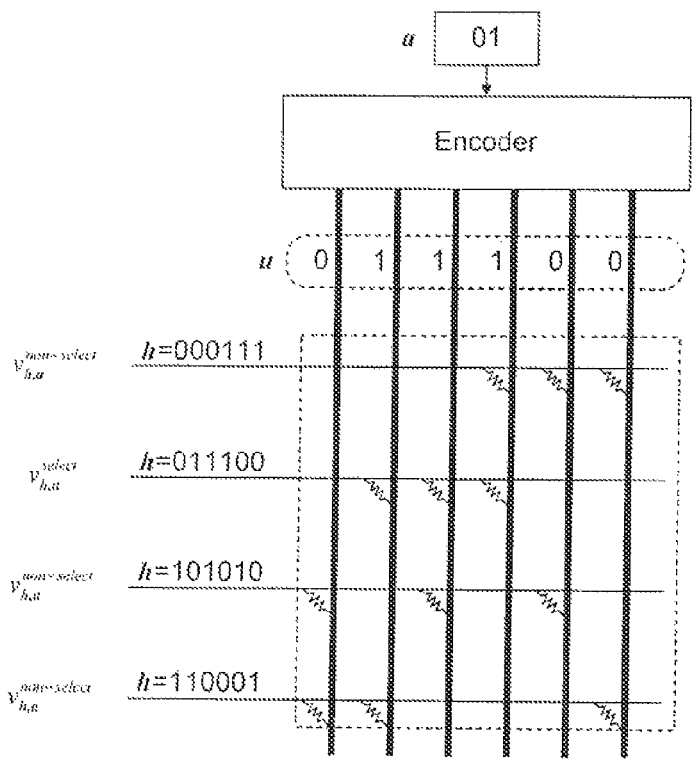
Figure 19C:
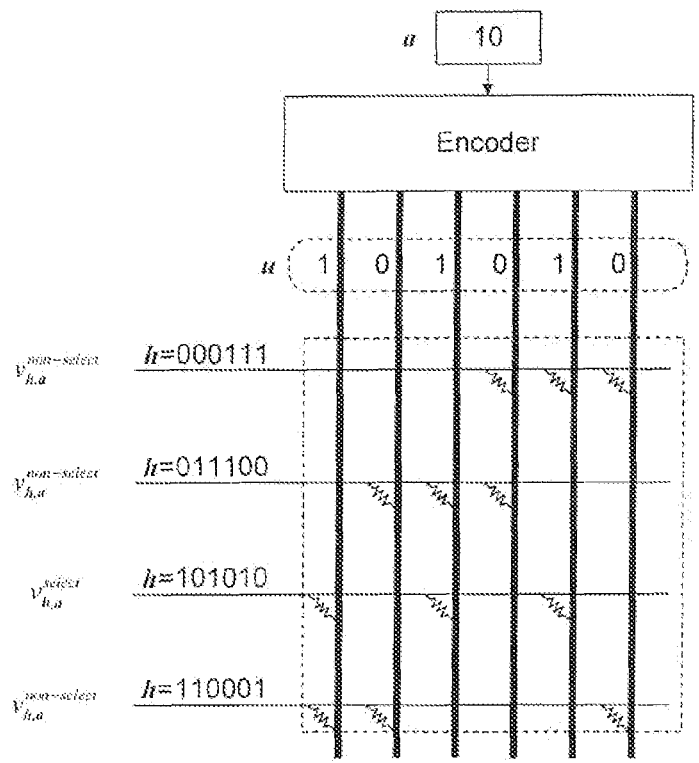
Figure 19D:
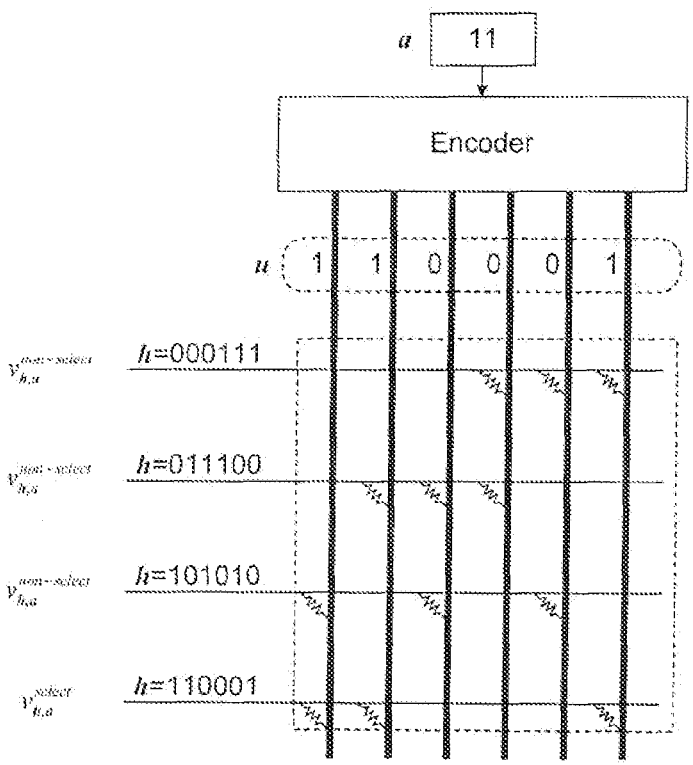

Because the codeword u 1904 matches the nanowire address h of the nanowire 1304, the magnitude of the voltage output on the selected nanowire 1304 $|v_{h,a}^{(s)}|$ is larger than the magnitude of the voltage output on the remaining non-selected nanowires $|v_{h,a}^{(ns)}|$. FIGS. 19B-19D shows the pattern of voltages output on the nanowires of the same encoder demultiplexer shown in FIG. 19A for the input addresses "01," "10," and "11," respectively.

II. Writing to Crossbar-Memory Junctions of a Crossbar-Memory System

Various embodiments of the present invention are directed to methods for writing to crossbar memory junctions of crossbar-memory arrays. The nonlinear-tunneling-hysteretic resistors, which can be configured to function as single bit memory elements, are two-terminal devices that may be thought of as voltage controlled variable resistors. As described above with reference to FIG. 5, applying a high-magnitude voltage drop to a nonlinear-tunneling-hysteretic resistor destroys the resistor, and applying a low-magnitude voltage drop leaves the conductance state of the nonlinear-tunneling-hysteretic resistor unchanged. On the other hand, a moderate-magnitude voltage drop, or "WRITE voltage," applied to the crossbar memory junction changes the conductance state to either a low-conductance state or a high-conductance state, where the low-conductance state represents a binary value "0," and the high-conductance state represents a binary value "1." As a result, writing to crossbar memory junctions of a crossbar-memory array is accomplished by delivering a controlled WRITE voltage to a selected crossbar memory junction, while delivering voltages with magnitudes that are less than the WRITE-voltage thresholds $|V_{w1}|$ and $|V_{w0}|$ to all of the remaining crossbar memory junctions of the crossbar-memory array. Each crossbar memory junction of a crossbar-memory array occurs at the overlap point of a row nanowire and a column nanowire, so that the voltages that occur on the $2^k$ output nanowires of each of the two demultiplexers define the voltage drops across each of the $2^k \times 2^k$ nonlinear-tunneling-hysteretic resistors in the crossbar-memory array.

FIG. 20 illustrates applying a write voltage to the selected crossbar memory junction 1318 of the crossbar-memory system 1300 shown in FIG. 13 that represents an embodiment of the present invention. As shown in FIG. 20, the encoders 1320 and 1324 receive a row address 2002 and a column address 2004, respectively. The encoder 1320 produces a voltage pattern u 2006 on the microscale signal lines that corresponds to a selected row nanowire 2008, which has a voltage output different from the voltages output on all the remaining non-selected row nanowires, and the encoder 1324 produces a voltage pattern t 2010 on the microscale signal lines that determines a selected column nanowire 2012, which also has a voltage output different from the voltages output on all the remaining non-selected column nanowires, as described above with reference to FIGS. 16-19. Note that, as described above with reference to FIG. 15, the orientation of crossbar junctions (not shown) of the two demultiplexers 1318 and 1320 are mirror images of one another. As a result, the maximum-magnitude voltage drop at the crossbar memory junctions of the crossbar-memory array 1308 occurs at the selected crossbar memory junction 1318. Also note that in order to accomplish the WRITE operation at the selected crossbar memory junction 1318, the crossbar junctions of the row mux 1314 and the crossbar junctions of the column mux 1316 are all in a low-conductance state.

Figure 21:
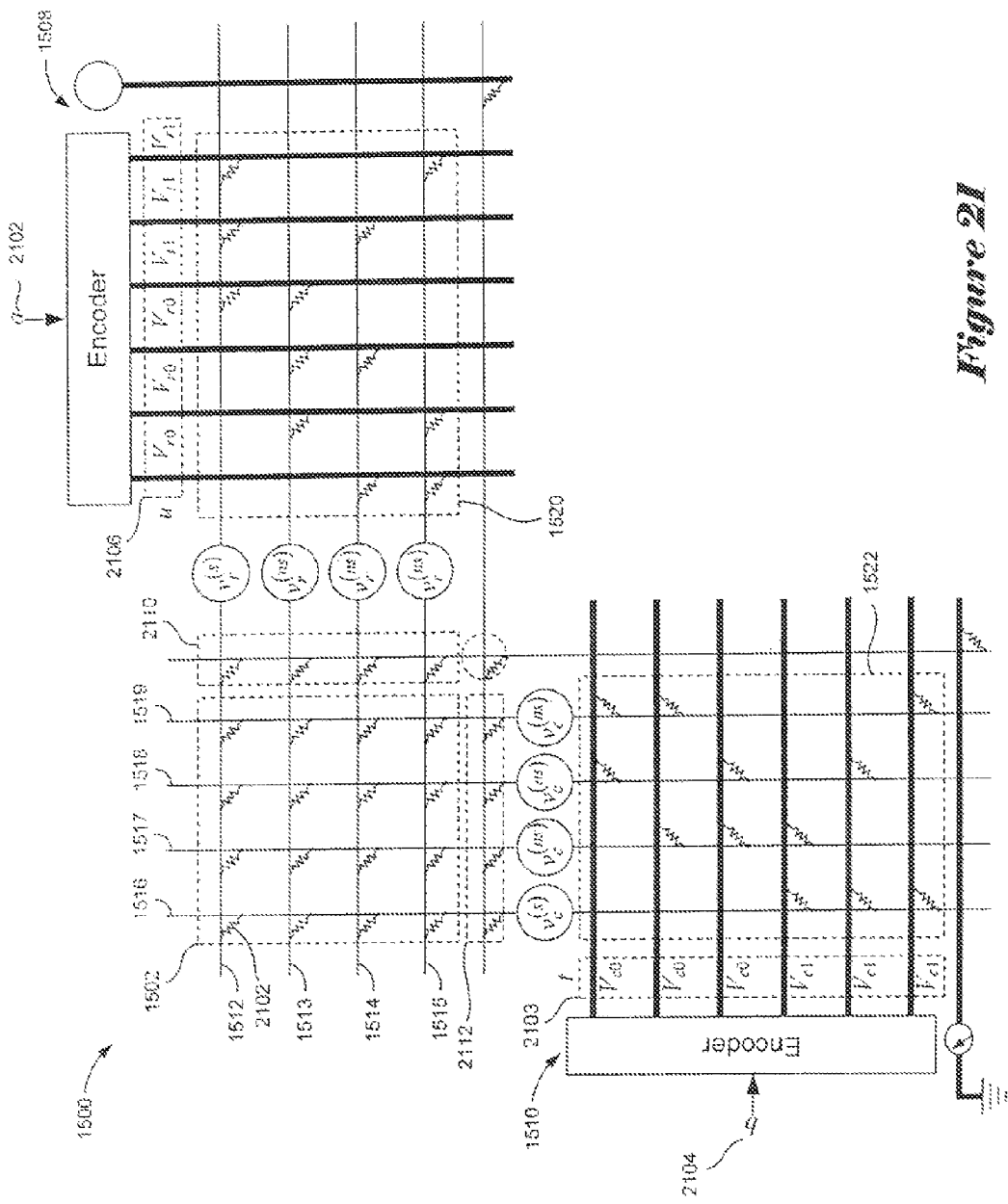
FIG. 21 illustrates writing a memory state to a selected crossbar memory junction of the crossbar-memory array shown in FIG. 15 that represents an embodiment of the present invention.

A more detailed example of the WRITE operation is described below with reference to the crossbar-memory system 1500 shown in FIG. 15. FIG. 21 illustrates writing a memory state to a selected crossbar memory junction 2102 of the crossbar-memory array 1502 that represents an embodiment of the present invention. The encoders of the encoder-demultiplexers 1508 and 1510 receive external addresses a 2102 and b 2104, respectively, which correspond to the address of a row nanowire 1512 and the address of a column nanowire 1516. As shown in FIG. 21, inputting the external address "00" for a 2102 to the encoder of the encoder-demultiplexer 1508 produces a voltage pattern u 2106 on the microscale signal lines that corresponds to the address "000111" of the nanowire 1512. The tunneling-resistor junctions of the nanowire 1512 each receive the same absolute voltage $V_{r1}$ on one side and each of the three tunneling-resistor junctions of the remaining non-selected nanowires 1513-1515 receives a different voltage $V_{r0}$, where $|V_{r1}|>|V_{r0}|$. The voltage output on the selected nanowire 1512, represented by $v_r^{(s)}$, is different from the voltage output on each of the three non-selected nanowires, which is represented by $v_r^{(ns)}$, and the magnitude $|v_r^{(s)}|$ is greater than the magnitude $|v_r^{(ns)}|$. Inputting the address "00" for b 2104 to the encoder of the encoder demultiplexer 1510 causes the tunneling-resistor junctions of the nanowire 1516 to each receive the same absolute voltage $V_{c1}$ on one side and each of the three tunneling-resistor junctions of the remaining non-selected nanowires 1517-1519 to receive a different voltage $V_{c0}$, where $|V_{c1}|>|V_{c0}|$. A voltage pattern t 2108 is output on the microscale signal lines. The voltage output on the selected nanowire 1516, represented by $v_c^{(s)}$, is different from the voltage output on each of the three non-selected nanowires, which is represented by $v_c^{(ns)}$. As a result, the largest voltage drop occurs at the crossbar memory junction 2102. Note that the crossbar junctions of the row mux 2110 and the crossbar junctions of the column mux 2112 are all in a low-conductance state. Note that the four voltages $V_{r1}$, $V_{r0}$, $V_{c1}$, and $V_{c0}$ are selected so that the voltage drop across the selected crossbar junction is larger than the voltage drop across non-selected crossbar junctions. This can be accomplished by, for example, choosing the four voltages such that $V_{r1}>V_{r0}$, $V_{c1}>V_{c0}$, and $|V_{r1}-V_{c1}51>|V_{r0}-V_{c0}|$.

Assuming that loading does not distort the output voltages of the encoder-demultiplexers 1508 and 1510, and that the resistance of the nanowires and microscale signal lines of the encoder-demultiplexers 1508 and 1510 is negligible, the voltage drop across each crossbar memory junction of the crossbar-memory array 1318 can be approximated by subtracting the column nanowire voltages from the row nanowire voltages. The magnitude of the voltage difference $|v_r^{(s)}-v_c^{(s)}|$ at the selected crossbar memory junction 2102 is greater than the magnitude of the voltage differences $|v_r^{(s)}-v_c^{(ns)}|$, $|v_r^{(ns)}-v_c^{(s)}|$, and $|v_r^{(ns)}-v_c^{(ns)}|$ at the remaining non-selected crossbar memory junctions.

Figure 22:
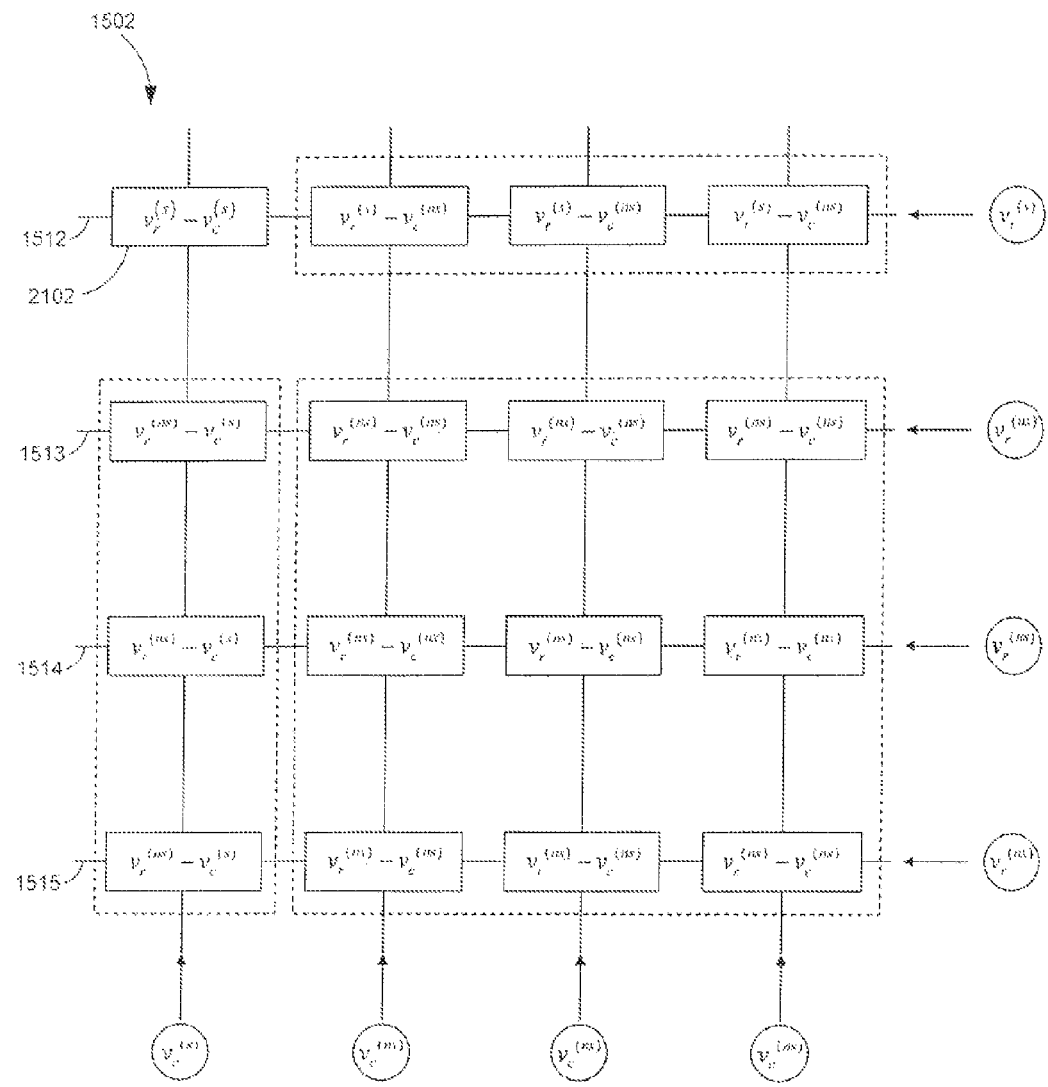
FIG. 22 shows voltage drops across each crossbar memory junction of the crossbar-memory array shown in FIG. 15 that represents an embodiment of the present invention.

FIG. 22 shows voltage drops across each crossbar memory junction of the crossbar-memory array 1502 that represents an embodiment of the present invention. In FIG. 22, the voltage drop across each crossbar memory junction is identified as a voltage difference obtained by subtracting the column-nanowire voltage from the row-nanowire voltage. Referring to FIG. 5, when the voltage drop $v_r^{(s)}-v_c^{(s)}$ across the crossbar memory junction 2002 is in the WRITE "1" voltage range 520, the crossbar memory junction 2102 is forced into a high-conductance state, and when the voltage drop $v_r^{(s)}-v_c^{(s)}$ across the crossbar memory junction 2102 is in the WRITE "0" voltage range 524, the crossbar memory junction 2102 is forced into a low-conductance state. Provided the voltage drops across the remaining crossbar memory junctions are within the voltage range $[V_{w0},V_{w1}]$, there are no unwanted conductance state changes at the non-selected crossbar memory junctions. Therefore, the foregoing process has accomplished writing a data value to the addressed memory cell in the memory array.

III. Reading from Crossbar-Memory Junctions of a Crossbar-Memory System

Various embodiments of the present invention are directed to reading an unknown memory state of a selected crossbar memory junction of a crossbar-memory array. Because data is stored in a crossbar-memory array as high or low-conductance states for the nonlinear-tunneling-hysteretic resistors at crossbar memory junctions, the memory states stored in the crossbar-memory array may affect the voltages and currents used to READ the memory state of a selected crossbar memory junction. The READ method of the present invention is able to determine the memory state of a selected crossbar memory junction in spite of the variability and unknown memory states of other crossbar memory junctions in a crossbar-memory array. In order to handle the problem of variability and unknown bits states, the READ method includes performing measurements of the currents passing through the selected crossbar memory junction for different high and low-conductance states of the selected crossbar memory junction. The READ method includes the following steps. First, a current is passed through a selected crossbar memory junction whose unknown memory state is desired, and the current $I_{SC}$ is measured and stored. Note that current may also flow through other paths, which may obscure the measurement. Next, the WRITE "0" operation is performed in order to WRITE the selected crossbar memory junction into a low-conductance state. A current is passed through the selected crossbar memory junction, and the current $I_0$ is measured and stored. Next, the WRITE "1" operation is performed in order to WRITE the selected crossbar memory junction into a high-conductance state. A current is again passed through the selected crossbar memory junction, and the current $I_1$ is measured and stored. The two currents $I_0$ and $I_1$ are used as reference currents to determine whether or not the current $I_{SC}$ indicated that the selected crossbar memory junction was in a bit "1" or a bit "0" state.

One READ method embodiment of the present invention is described below with reference to the selected crossbar memory junction 1318 of the crossbar-memory system 1300 shown in FIG. 13. In the interest of brevity, structurally identical components in the crossbar-memory system 1300, shown below in FIGS. 23-25, have been provided with the same reference numerals but explanations of the components structure and function are not repeated.

First, the entire set of nonlinear-tunneling-hysteretic resistors in the row and column muxes 1314 and 1316 of the crossbar-memory system 1300 shown in FIG. 13 are cleared. In other words, the WRITE operation described above is used repeatedly to WRITE each crossbar junction in the row and column muxes 1314 into a low-conductance state. For example, in FIG. 13, the crossbar junctions of the column mux 1316 are written into a low-conductance state by applying a voltage to the nanowire 1312 from a voltage source, such as the voltage source 1332, and successively inputting the address of each column nanowire into the encoder-demultiplexer 1306 so that each crossbar junction of the column mux 1316 receives, in turn, a voltage drop that falls within the WRITE "0" voltage range 524 shown in FIG. 5. Likewise, the crossbar junctions of the row mux 1314 are written into a low-conductance state by applying a voltage to the nanowire 1310 and successively inputting the address of each row nanowire into the encoder-demultiplexer 1304 so that each crossbar junction of the row mux 1314 receives, in turn, a voltage drop that falls within the write "0" voltage range 524. Note that it may be possible to perform this operation in a single step, by either erasing the single switch in the multiplexer previously written to in a high-conductance state, or by simultaneously clearing the entire multiplexer by putting the voltage corresponding to WRITE "0" across all resistors in the multiplexer.

Figure 23:
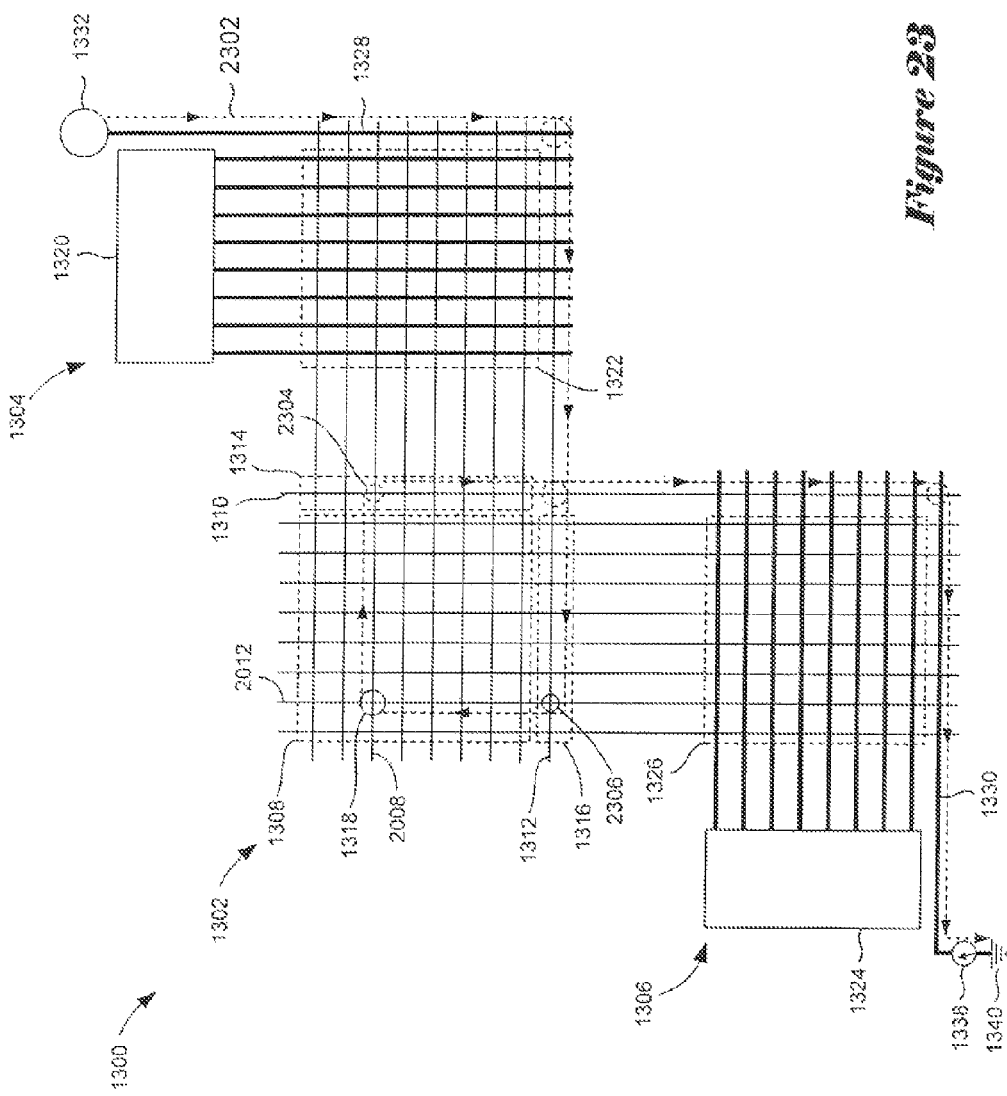
FIG. 23 shows an ideal conductance path that passes through a selected crossbar memory junction of the crossbar-memory system shown in FIG. 13 that represents an embodiment of the present invention.

Next, in order to determine the currents $I_{SC}$, $I_0$, and $I_1$ passing through the selected crossbar memory junction 1318, an ideal conductance path is created between the voltage source 1332 and the ground 1340 through the selected crossbar memory junction 1318 as follows. FIG. 23 shows an ideal conductance path represented by dashed-line directional arrows, such as dashed-line directional arrow 2302, that passes through the selected crossbar memory junction 1318 that represents an embodiment of the present invention. The ideal conductance path corresponds to the minimum number of nonlinear-tunneling-hysteretic resistors that the currents $I_{SC}$, $I_0$, and $I_1$ pass through in series from the voltage source 1332 to the ground 1340. In order to create the ideal conductance path, the low-conductance states of the crossbar junction 2304 of the row mux 1314 and the crossbar junction 2306 of the column mux 1316 both need to be changed to high conductance states.

FIGS. 24A-24B illustrates changing the conduction states of the crossbar junction 2302 and 2304 that represents an embodiment of the present invention. As shown in FIG. 24A, the crossbar junction 2306 of the column mux 1316 is written into a high-conductance state by applying a voltage to the nanowire 1312 from a voltage source and inputting the address 2402 of the column nanowire 2308 into the encoder 1324. Directional arrows 2404 and 2406 represent voltages on the row and column nanowires 1312 and 2308, respectively. The voltage drop across the crossbar junction 2306 falls within the WRITE "1" voltage range 520 shown in FIG. 5, and the corresponding nonlinear-tunneling-hysteretic resistor switches from a low-conductance state to a high-conductance state. As shown in FIG. 24B, the crossbar junction 2304 of the row mux 1314 is written into a high-conductance state by supplying a voltage to the column nanowire 1310 and inputting the address 2408 of the row nanowire 2306 into the encoder 1320. Directional arrows 2410 and 2412 represent voltages on the row nanowire 2306 and the column nanowire 1310, respectively. The voltage drop across the crossbar junction 2304 falls within the WRITE "1" voltage range 520, and the corresponding nonlinear-tunneling-hysteretic resistor switches from a low-conductance state to a high-conductance state.

Figure 25:
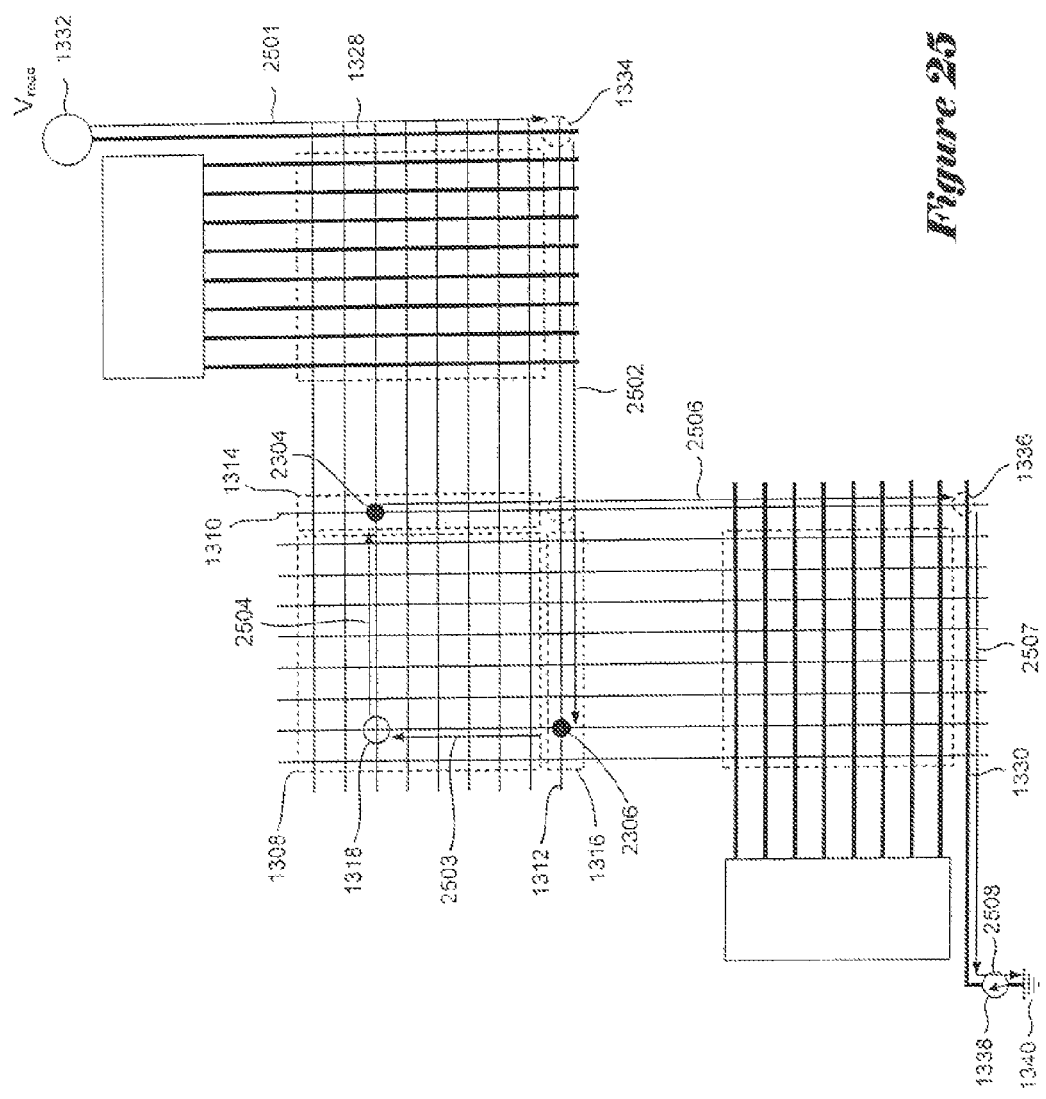
FIG. 25 illustrates current flowing along an ideal conductance path in the crossbar-memory system shown in FIG. 13 that represents an embodiment of the present invention.

Next, the READ voltage $V_{read}$ supplied by the voltage source 1332 is applied to the wire 1328 in order to create a current that flows along the ideal conductance path through the selected crossbar memory junction 1318. FIG. 25 illustrates current flowing along the ideal conductance path through the selected crossbar memory junction 1318 that represents an embodiment of the present invention. As shown in FIG. 25, the voltage source 1332 supplies a READ voltage $V_{read}$ on the wire 1328. Because the crossbar junctions 1334, 1336, 2304 and 2306 are each in a high-conductance state, current flows from the voltage source 1332 to the ground 1340 along the ideal conductance path in the direction identified by directional arrows 2501-2508. The current $I_{SC}$ is then measured and recorded by the meter 1338.

Next, the high-conductance states of the crossbar junctions 2304 and 2306 of the row and column muxes 1314 and 1316, respectively, are cleared, as described above. The WRITE operation is then used to WRITE a low-conductance state (bit "0") to the crossbar memory junction 1318. The ideal conductance path shown in FIG. 25 is again created through the selected crossbar memory junction 1318, as described above with reference to FIG. 24, and the READ voltage $V_{read}$ is supplied to create a current $I_0$ that follows the ideal conductance path. The current $I_0$ is measured and recorded by the meter 1338.

Next, the high-conductance states of the crossbar junctions 2304 and 2306 of the row and column muxes 1314 and 1316, respectively, are again cleared, and the WRITE operation is used this time to WRITE a high-conductance state (bit "1") to the crossbar junction 1318. The ideal conductance path shown in FIG. 25 is again created through the selected crossbar memory junction 1318, as described above with reference to FIG. 24, and the READ voltage $V_{read}$ is supplied to create a current $I_1$ that follows the conduction path. The current $I_1$ is measured and recorded by the meter 1338.

The currents $I_0$ and $I_1$ are reference currents that can be used to determine a threshold current $I_T$ for assessing the original memory state of the crossbar memory junction 1318. The threshold current can be a weighted average given by:

$$I_T = w_0 I_0 + w_1 I_1$$

where $w_0$ and $w_1$ are both in the interval [0,1], and $$w_0 + w_1 = 1$$

When $I_{SC}$ is on the $I_1$ side of $I_T$, the original memory state of the selected crossbar memory junction is "1," and when $I_{SC}$ is on the $I_0$ side of $I_T$, the original memory state of the selected crossbar memory junction is "0."

The nonlinear-tunneling resistor behavior can be used to advantage over linear resistor junctions when reading crossbar memory junctions of a crossbar memory. For example, when the READ voltage $V_{read}$ is applied, the current may actually take, in addition to the ideal conductance path, one or more other conductance paths through a series of nonlinear-tunneling-hysteretic resistors of the crossbar-memory array. However, because of the nonlinear properties of the nonlinear-tunneling resistors described above with reference to FIGS. 4-5, the selected crossbar memory junction receives the largest voltage drop, while the currents flowing in the other multiple-resistor paths flow through a number of nonlinear-tunneling resistors in series, which suppresses the current carried by the one or more other conduction paths. In fact, when the current of other conduction paths flows through three or more nonlinear-tunneling resistors, the reduction in current is significant when compared to the current flowing through two nonlinear-tunneling resistors, as described above with reference to FIGS. 4-6.

Although the present invention has been described in terms of particular embodiments, it is not intended that the invention be limited to these embodiments. Modifications within the spirit of the invention will be apparent to those skilled in the art. For example, in an alternate embodiment of the present invention, the properties of constant-weight codes identified as being favorable for the described embodiments may also be useful in pure microscale devices, and other devices. Although, in the described embodiments, each addressed nanowire has a unique internal address corresponding to a codeword of a code, in alternative embodiments of the present invention, two or more nanowires may have the same code address, and may be simultaneously selected. Although the described embodiments all use voltage signals, current signals and other types of signals may be employed in alternative embodiments. While the distinguished signals output to selected nanowires are higher-voltage signals than the signals output to non-selected nanowires, in alternative embodiments of the present invention, the distinguished signals may have a smaller magnitude or opposite voltage polarity than those output to non-selected nanowires. In an alternate embodiment of the present invention, rather than employing a 2-level reconfigurable tunneling resistor junctions at each crossbar memory junction of the crossbar-memory array, 3 or distinguishable state of the reconfigurable tunneling-hysteretic resistor junctions can be employed at each crossbar memory junctions of the crossbar-memory array. In other words, the present invention is not limited to storing a single bit at each crossbar memory junction of the crossbar-memory array, instead one or bits can be stored at each crossbar memory junction of the crossbar-memory array. In an alternate embodiment of the present invention, after the memory state "0" of a selected crossbar memory junction has been READ, the original memory state "0" can be restored by first clearing crossbar junctions of the row and column muxes, and then writing a low-conductance state to the selected crossbar junction.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the claims and their equivalents.

What is claimed is:

1. A crossbar-memory system comprising:
    a first layer of microscale signal lines and a second layer of microscale signal lines;
    a first layer of one or more nanowires configured so that each first layer nanowire overlaps each first layer microscale signal line;
    a second layer of one or more nanowires configured so that each second layer nanowire overlaps each second layer microscale signal line and overlaps each first layer nanowire;
    nonlinear-tunneling resistors configured to selectively connect first layer nanowires to first layer microscale signal lines and to selectively connect second layer nanowires to second layer microscale signal lines; and
    nonlinear tunneling-hysteretic resistors configured to connect each first layer nanowire to each second layer nanowire at each crossbar intersection.

2. The crossbar-memory system of claim 1 further comprising:
    a first multiplexer configured to multiplex the first layer of one or more nanowires; and
    a second multiplexer configured to multiplex the second layer of one or more nanowires.

3. The crossbar-memory system of claim 2 wherein
    the first multiplexer further comprises a first wire that overlaps each first layer nanowire and a nonlinear tunneling-hysteretic resistor connects each first layer nanowire to the first wire, at each overlap point; and
    the second multiplexer further comprises a second wire that overlaps each second layer nanowire and a nonlinear tunneling-hysteretic resistor connects each first layer nanowire to the second wire, at each overlap point.

4. The crossbar-memory system of claim 1, further comprising:
    a first encoder connected to the first set of microscale signal lines; and
    a second encoder connected to the second set of microscale signal lines.

5. The crossbar-memory system of claim 4, wherein the encoders generate an n-bit-code codeword internal address for each different input address received on input signal lines.

6. The crossbar-memory system of claim 1, wherein each microscale signal line carries a voltage corresponding to one bit of an n-bit-code codeword output from a connected encoder.

7. The crossbar-memory system of claim 1, wherein each nanowire in the first layer has an address corresponding to an n-bit-code codeword, and each nanowire in the second layer of one or more nanowires also has an address corresponding to an n-bit-code codeword.

8. The crossbar-memory system of claim 1, wherein each nanowire in the first layer and the second layer has a distinguishable associated n-bit-code codeword internal address.

9. The crossbar-memory system of claim 1, wherein each reconfigurable tunneling-hysteretic resistor has two or more distinguishable conductance states.

10. The crossbar-memory system of claim 9, wherein the multiple conductance states correspond to storing one or more bits of information.

* * * * *